(12) United States Patent
Tsai et al.

(10) Patent No.: US 12,040,321 B2
(45) Date of Patent: Jul. 16, 2024

(54) OPTICAL DEVICE INCLUDING AN OPTICAL COMPONENT AN ELECTRICAL COMPONENT, ASSEMBLY STRUCTURE INCLUDING AN OPTICAL COMPONENT AN ELECTRICAL COMPONENT AND METHOD FOR MANUFACTURING THE SAME

(71) Applicant: Advanced Semiconductor Engineering, Inc., Kaohsiung (TW)

(72) Inventors: Hsiang-Cheng Tsai, Kaohsiung (TW); Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/949,139

(22) Filed: Sep. 20, 2022

(65) Prior Publication Data

US 2024/0096864 A1 Mar. 21, 2024

(51) Int. Cl.
*H01L 25/16* (2023.01)
*G01J 1/04* (2006.01)

(52) U.S. Cl.
CPC .......... *H01L 25/167* (2013.01); *G01J 1/0403* (2013.01)

(58) Field of Classification Search
CPC ... H01L 25/167; H01L 31/0203; G01J 1/0403
USPC ....................................................... 250/216
See application file for complete search history.

(56) References Cited

U.S. PATENT DOCUMENTS

| 9,899,305 | B1 * | 2/2018 | Yeh ........................ H01L 23/562 |
| 10,069,056 | B2 * | 9/2018 | Yamashita .............. H01L 33/38 |
| 2003/0185484 | A1 * | 10/2003 | Chakravorty ........ G02B 6/4255 |
| | | | 385/14 |
| 2005/0247859 | A1 * | 11/2005 | Hsu ..................... H01L 31/0203 |
| | | | 257/E31.117 |
| 2013/0248887 | A1 * | 9/2013 | Coffy ..................... H01L 31/18 |
| | | | 438/25 |
| 2018/0301443 | A1 * | 10/2018 | Kim ...................... H01L 23/367 |
| 2022/0246772 | A1 * | 8/2022 | Wilcoxon ........... H01L 23/3675 |
| 2023/0268331 | A1 * | 8/2023 | Park ...................... H01L 25/165 |
| | | | 257/82 |

OTHER PUBLICATIONS

U.S. Appl. No. 17/566,573, filed Dec. 30, 2021, Yu et al.

* cited by examiner

*Primary Examiner* — Thanh Luu
*Assistant Examiner* — Mai Thi Ngoc Tran
(74) *Attorney, Agent, or Firm* — FOLEY & LARDNER LLP

(57) ABSTRACT

An optical device includes an optical component and an electrical component. The optical component has a sensing surface and a backside surface opposite to the sensing surface. The electrical component is disposed adjacent to the backside surface of the optical component and configured to support the optical component. A portion of the backside surface of the optical component is exposed from the electrical component.

4 Claims, 23 Drawing Sheets

OPTICAL DEVICE INCLUDING AN OPTICAL COMPONENT AN ELECTRICAL COMPONENT, ASSEMBLY STRUCTURE INCLUDING AN OPTICAL COMPONENT AN ELECTRICAL COMPONENT AND METHOD FOR MANUFACTURING THE SAME

BACKGROUND

1. Field of the Disclosure

The present disclosure relates to an optical device including an electrical component, an assembly structure and a method for manufacturing the same.

2. Description of the Related Art

Along with the rapid development in electronics industry and the progress of semiconductor processing technologies, a large number of electronic components are disposed on a substrate. In order to dispose more electronic components on the substrate, the size of the electronic component is a critical issue.

SUMMARY

In some embodiments, an optical device includes an optical component and an electrical component. The optical component has a sensing surface and a backside surface opposite to the sensing surface. The electrical component is disposed adjacent to the backside surface of the optical component and configured to support the optical component. A portion of the backside surface of the optical component is exposed from the electrical component.

In some embodiments, an assembly structure includes a substrate, an electrical component, an optical component and an element. The electrical component is disposed on and electrically connected to the substrate. The optical component is disposed on and electrically connected to the electrical component. The element is disposed on and electrically connected to the substrate, and disposed adjacent to the electrical component. A horizontal gap between the element and the electrical component is greater than a horizontal gap between the element and the optical component.

In some embodiments, a method for manufacturing an optical device includes: providing an optical structure including a plurality of units, wherein each of the plurality of units has a sensing surface and a backside surface opposite to the sensing surface; disposing a plurality of electrical components on the backside surfaces of the plurality of units of the optical structure; and singulating the optical structure to form a plurality of optical devices.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
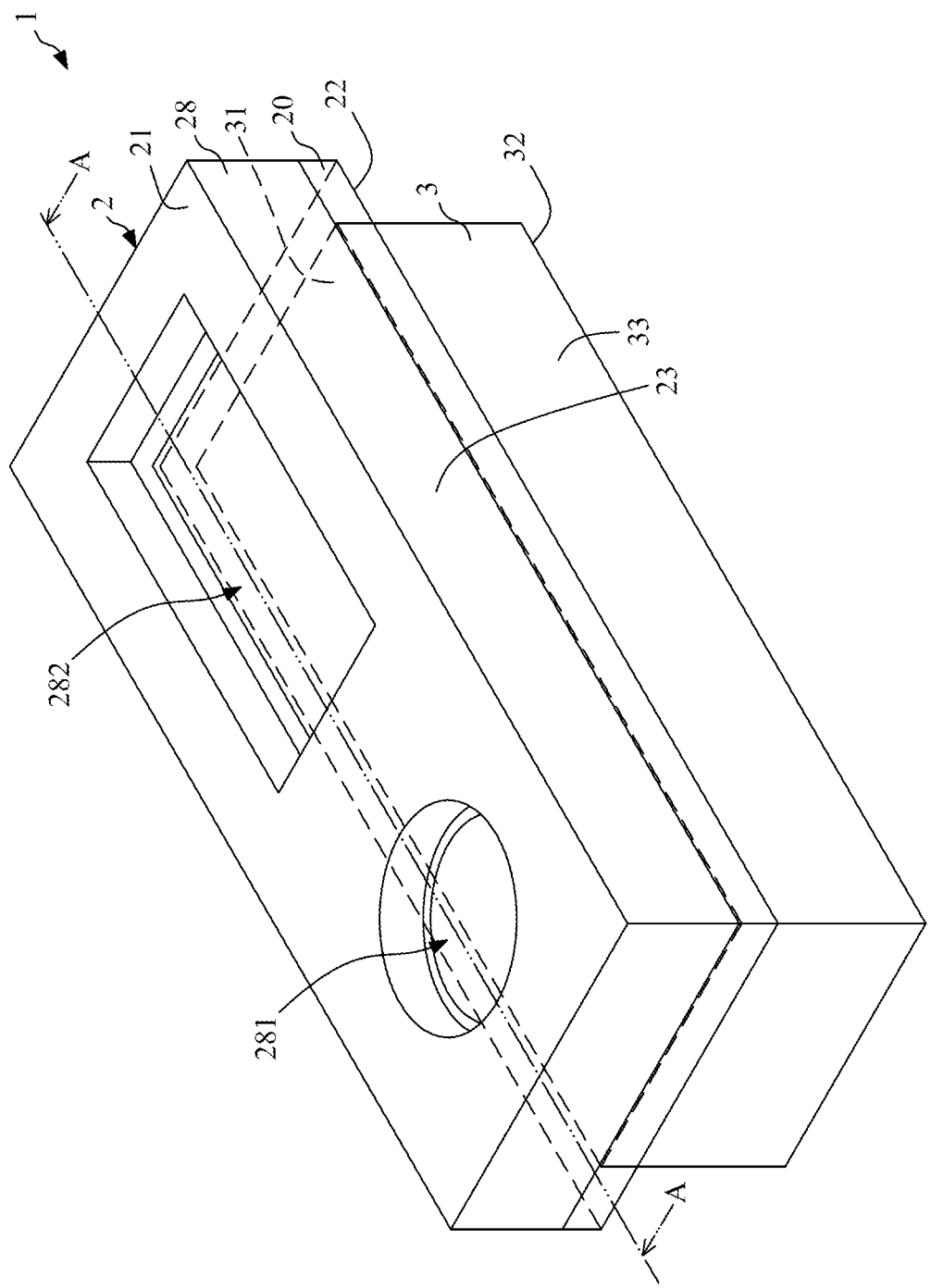
FIG. 1 illustrates a perspective view of an optical device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
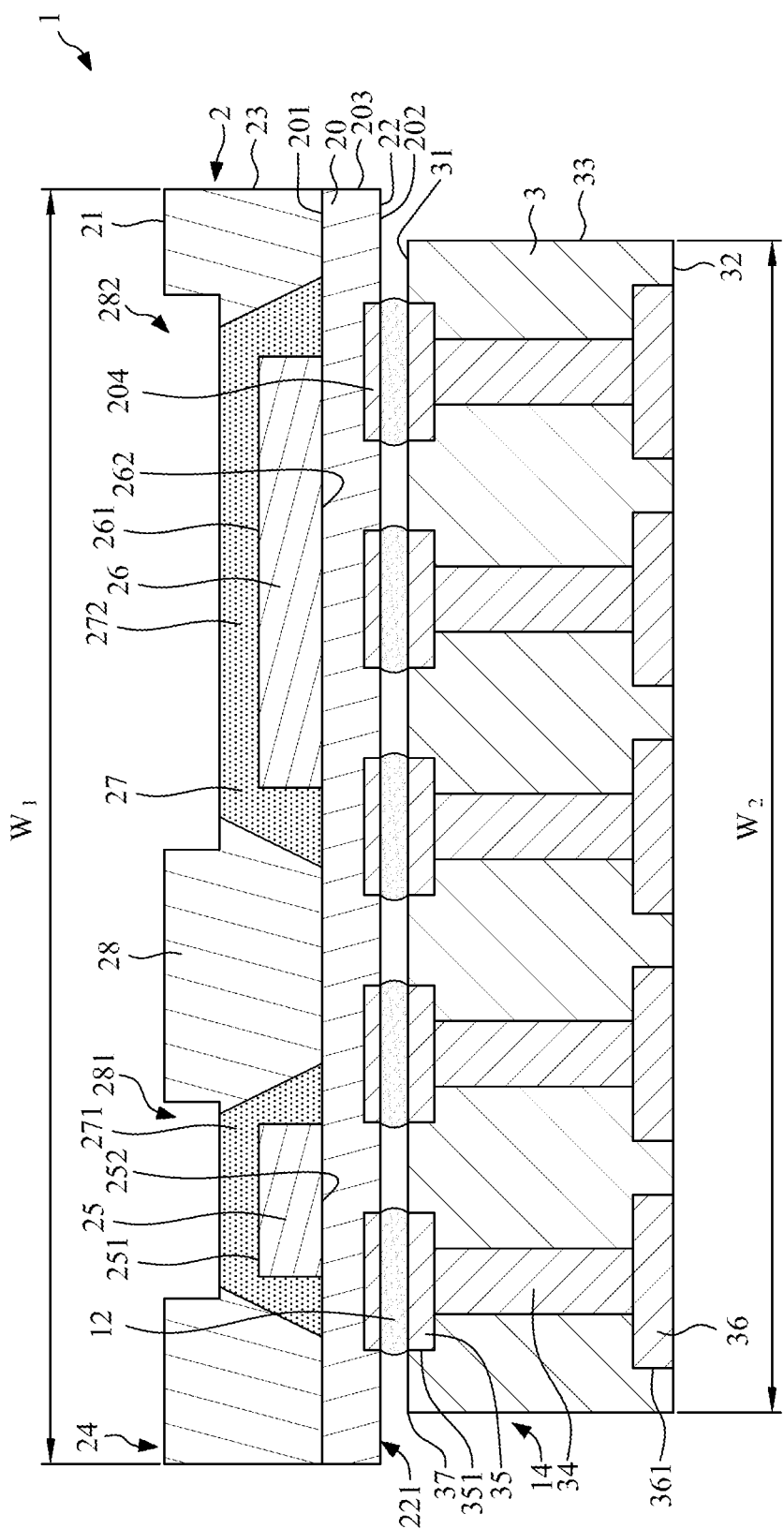
FIG. 2 illustrates a cross-sectional view taken along line A-A of the optical device of FIG. 1.
Figure 3:
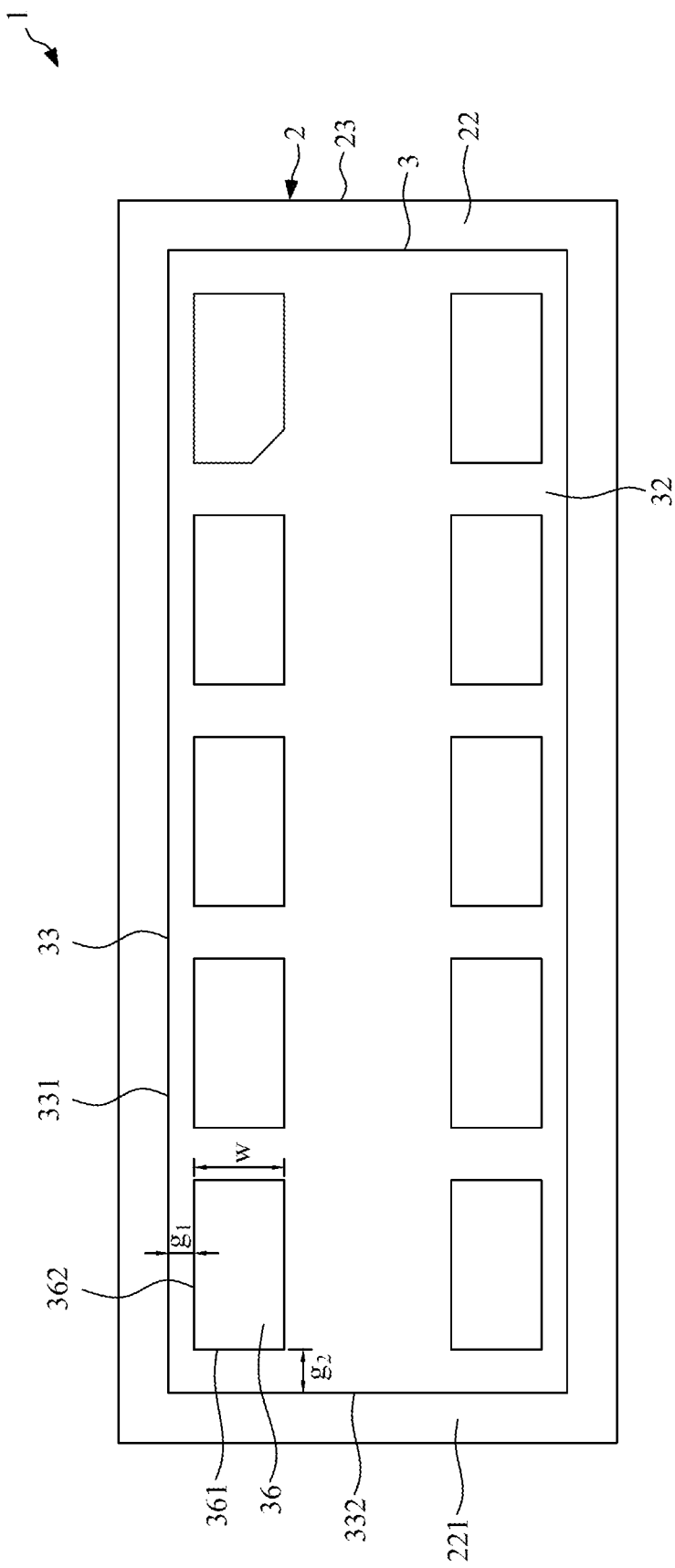
FIG. 3 illustrates a bottom view of the optical device of FIG. 1.

FIG. 1 illustrates a perspective view of an optical device 1 according to some embodiments of the present disclosure. FIG. 2 illustrates a cross-sectional view taken along line A-A of the optical device 1 of FIG. 1. FIG. 3 illustrates a bottom view of the optical device 1 of FIG. 1.

The optical device 1 may include an optical component 2, an electrical component 3 and a plurality of connecting elements 12. The optical component 2 may be a sensor or a package structure such as an organic land grid array (OLGA) package. The optical component 2 may have a sensing surface 21, a backside surface 22 and a lateral surface 23. For example, the sensing surface 21 may be a top surface or a first surface, and may be a surface or a side that transmits and/or receives light. For example, the sensing surface 21 may be a surface or a side that a light or an optical signal passes through. Further, the backside surface 22 may be opposite to the sensing surface 21, and may face the electrical component 3. The backside surface 22 may be a surface or a side that an electrical path passes through. In addition, the lateral surface 23 may extend between the backside surface 22 and the sensing surface 21.

The optical component 2 may include a substrate 20, a light emitting component 25, a light receiving component 26, an encapsulant 27 and a light shielding structure 28. The substrate 20 may have a first surface 201, a second surface 202 opposite to the first surface 201, and a lateral surface 203 extending between the first surface 201 and the second surface 202. The second surface 202 of the substrate 20 may be the backside surface 22 of the optical component 2. The substrate 20 may be an embedded trace substrate or a circuit pattern structure. For example, the substrate 20 may include a first circuit layer (such as a redistribution layer (RDL) or a fan-out circuit layer) adjacent to the first surface 201, a second circuit layer (such as a redistribution layer (RDL) or a fan-out circuit layer) adjacent to the second surface 202, and a plurality of conductive vias electrically connecting the first circuit layer and the second circuit layer. In some embodiments, the second circuit layer may include at least one bonding pads 204 exposed from the second surface 202.

The light emitting component 25 may be disposed over and/or attached to the substrate 20. The light emitting component 25 may have a first surface 251 (e.g., a top surface) and a second surface 252 (e.g., a bottom surface) opposite to the first surface 251. For example, the second surface 252 of the light emitting component 25 may be attached to the first surface 201 of the substrate 20 through an adhesive. The light emitting component 25 may be electrically connected to the first circuit layer of the substrate 20 through a bonding wire. Alternatively, the light emitting component 25 may be electrically connected to the first circuit layer of the substrate 20 through flip chip bonding. The light emitting component 25 may have a light emitting area, which may include at least a portion of the first surface 251 of the light emitting component 25. The light emitting component 25 may be an optical component which is able to emit light of a single wavelength or a range of wavelengths, such as a laser diode or a vertical cavity surface-emitting laser (VCSEL). Vertical cavity surface-emitting laser (VCSEL) is a laser diode with single-chip laser resonance function, which mainly emits light in a vertical direction substantially perpendicular to the first surface 251 of the light emitting component 25. Since the face recognition technology supported by VCSEL is introduced into smart phone, the demand for the VCSEL is increasing in the industry.

The light receiving component 26 may have a first surface 261 (e.g., a top surface) and a second surface 262 (e.g., a bottom surface) opposite to the first surface 261. The light receiving component 26 may be disposed over and/or attached to the substrate 20. For example, the second surface 262 of the light receiving component 26 may be attached to the first surface 201 of the substrate 20 through an adhesive. The light receiving component 26 may be electrically connected to the first circuit layer of the substrate 20 through a bonding wire. Alternatively, the light receiving component 26 may be electrically connected to the first circuit layer of the substrate 20 through flip chip bonding. The light receiving component 26 may have a light receiving area, which may include at least a portion of the first surface 261 of the light receiving component 26. The light receiving component 26 may be an optical component, such as a photodiode, which is able to receiving and/or detecting light reaching the light receiving area.

The encapsulant 27 may include a first encapsulant 271 covering the light emitting component 25, and a second encapsulant 272 covering the light receiving component 26. For example, the first encapsulant 271 and the second encapsulant 272 may be disposed on the first surface 201 of the substrate 20 and may encapsulate the light emitting component 25 and the light receiving component 26, respectively. The first encapsulant 271 and the second encapsulant 272 may be an encapsulant which allows light to pass therethrough. That is, the first encapsulant 271 and the second encapsulant 272 may be transparent or translucent. For example, the first encapsulant 271 and the second encapsulant 272 may be made of a clear epoxy molding compound without fillers. A material of the first encapsulant 271 may be the same as or different from a material of the second encapsulant 272. In addition, the top surface of the first encapsulant 271 and the top surface of the second encapsulant 272 may be a portion of the sensing surface 21 of the optical component 2.

The light shielding structure 28 may be disposed over and/or contact the first surface 201 of the substrate 20. The light shielding structure 28 may be around or may surround the encapsulant 27 (including the first encapsulant 271 and the second encapsulant 272). A portion of the light shielding structure 28 may be disposed between the light emitting component 25 and the light receiving component 26. Alternatively, a portion of the light shielding structure 28 may be disposed between the first encapsulant 271 and the second encapsulant 272. The light shielding structure 28 may define a first opening 281 and a second opening 282. The first opening 281 may correspond to the light emitting area of the light emitting component 25, and may expose a top surface of the first encapsulant 271. The second opening 282 may correspond to the light receiving area of the light receiving component 26, and may expose a top surface of the second encapsulant 272. A top surface of the light shielding structure 28 may be the sensing surface 21 or the top surface of the optical component 2. A lateral surface of the light shielding structure 28 may be substantially coplanar with the lateral surface 203 of the substrate 20.

The light shielding structure 28 may be made of a material which does not transmit light. For example, an optical density (OD) through the light shielding structure 28 at a given wavelength may be greater than 4 (OD 4), and preferably around 5 (OD 5) or greater. That is, the transmittance of the light shielding structure 28 at a given wavelength may be less than $10^{-4}$, and preferably around $10^{-5}$ or less. In some embodiments, the light shielding structure 28 may include molding compound or metal material.

The electrical component 3 may be a carrier, a substrate (e.g., an embedded trace substrate or a circuit pattern structure), an interposer, a semiconductor package or a semiconductor chip. The electrical component 3 may include a light absorbent material or a light transmissible material. The electrical component 3 may have a first surface 31 (e.g., a top surface), a second surface 32 (e.g., a bottom surface) opposite to the first surface 31, and at least one lateral surface 33 extending between the first surface 31 and the second surface 32. The electrical component 3 may include at least one first bonding pad 35, at least one second bonding pad 36, and at least one connector 34. The first bonding pad 35 may be disposed adjacent to and exposed from the first surface 31 of the electrical component 3, and may be used to be electrically connected to the substrate 20 of the optical component 2.

In some embodiments, the first bonding pad 35 may be a portion of a circuit layer such as a redistribution layer (RDL) or a fan-out circuit layer. The second bonding pad 36 may be disposed adjacent to and exposed from the second surface 32 of the electrical component 3, and may be used for external connection. In some embodiments, the second bonding pad 36 may be a portion of a circuit layer such as a redistribution layer (RDL) or a fan-out circuit layer. A size (e.g., height or width) of the second bonding pad 36 may be equal to or different from a size (e.g., height or width) of the first bonding pad 35. In addition, the connector 34 may be a conductive via or a conductive pillar, and may physically connect and/or electrically connect the first bonding pad 35 and the second bonding pad 36. Thus, the connector 34 may be configured to transmit a signal from the first surface 31 of the electrical component 3 to the second surface 32 of the electrical component 3, or may be configured to transmit a signal from the second surface 32 of the electrical component 3 to the first surface 31 of the electrical component 3.

The connecting element 12 may be a solder ball or a solder material such as reflowable material, and may physically connect and/or electrically connect the first bonding pad 35 of the electrical component 3 and the bonding pad 204 of the substrate 20 of the optical component 2. Thus, the optical component 2 may be electrically connected to the electrical component 3 through the connecting element 12.

As shown in FIG. 2 and FIG. 3, the first surface 31 of the electrical component 3 may be disposed adjacent to the backside surface 22 of the optical component 2. The electrical component 3 may be configured to support the optical component 2. An elevation of the optical component 2 may be raised by the thickness of the electrical component 3. The value of the elevation of the optical component 2 or the thickness of the electrical component 3 may be determined by the element(s) adjacent thereto, or by the design requirement for a final product. For example, the optical component 2 may be leveled with the element(s) adjacent thereto by utilizing the thickness of the electrical component 3. Alternatively, when the optical device 1 is included in a mobile phone, the optical component 2 may be close to a surface of the mobile phone to enlarge light receiving range.

In addition, a width $W_1$ of the optical component 2 may be greater than a width $W_2$ of the electrical component 3. Thus, a portion 221 of the backside surface 22 of the optical component 2 may be exposed from the electrical component 3. The exposed portion 221 of the backside surface 22 of the optical component 2 may be not covered by the electrical component 3 in a vertical direction. The lateral surface 33 of the electrical component 3 may be misaligned with and/or recessed from the lateral surface 23 of the optical component 2. In some embodiments, four lateral surfaces 33 of the electrical component 3 may be misaligned with and/or recessed from four lateral surfaces 23 of the optical component 2, respectively. The four lateral surfaces 33 of the electrical component 3 may be parallel with the four lateral surfaces 23 of the optical component 2, respectively.

As shown in FIG. 2, a vertical projection of the electrical component 3 on the backside surface 22 of the optical component 2 may be located within the backside surface 22 of the optical component 2. Further, the vertical projection of the electrical component 3 on the backside surface 22 of the optical component 2 may overlap the at least one bonding pad 204 on the backside surface 22 of the optical component 2. In some embodiments, the second circuit layer may include a plurality of bonding pads 204 exposed from the second surface 202, and the vertical projection of the electrical component 3 on the backside surface 22 of the optical component 2 may overlap the bonding pads 204. In addition, a periphery portion 24 of the optical component 2 may horizontally extend beyond a corner 37 of the electrical component 3. Thus, the lateral surface 33 of the electrical component 3 and the exposed portion 221 of the backside surface 22 of the optical component 2 may define an indentation structure 14.

As shown in FIG. 3, the second bonding pad 36 may have a first outermost edge 361 and a second outermost edge 362. The first outermost edge 361 may be adjacent to and parallel with a short edge 332 of the electrical component 3. The second outermost edge 362 may be adjacent to and parallel with a long edge 331 of the electrical component 3. In the cross-sectional view as shown in FIG. 2, a vertical extension of the lateral surface 33 of the electrical component 3 may be between a vertical extension of the lateral surface 23 of the optical component 2 and a vertical extension of the first outermost edge 361 of the second bonding pad 36. Similarly, the vertical extension of the lateral surface 33 of the electrical component 3 may be between the vertical extension of the lateral surface 23 of the optical component 2 and a vertical extension of the second outermost edge 362 of the second bonding pad 36. Similarly, the vertical extension of the lateral surface 33 of the electrical component 3 may be between the vertical extension of the lateral surface 23 of the optical component 2 and a vertical extension of an outermost edge 351 of the first bonding pad 35.

As shown in FIG. 3, the second bonding pad 36 may have a width w measured along a direction parallel with the short edge 332 of the electrical component 3. A first gap $g_1$ is a distance between the second outermost edge 362 of the second bonding pad 36 and the long edge 331 of the electrical component 3. The first gap $g_1$ may be less than the width w of the second bonding pad 36. For example, the first gap $g_1$ may be less than one half of the width w of the second bonding pad 36. In some embodiments, the first gap $g_1$ may be about 50 μm. In addition, a second gap $g_2$ is a distance between the first outermost edge 361 of the second bonding pad 36 and the short edge 332 of the electrical component 3. The second gap $g_2$ may be less than the width w of the second bonding pad 36. For example, the second gap $g_2$ may be less than one half of the width w of the second bonding pad 36. In some embodiments, the second gap $g_2$ may be about 50 μm. Similarly, a gap between an outermost edge of the first bonding pad 35 and a short edge (or a long edge) of the electrical component 3 may be less than a width of the first bonding pad 35, e.g., less than one half of the width of the first bonding pad 35.

Figure 4:
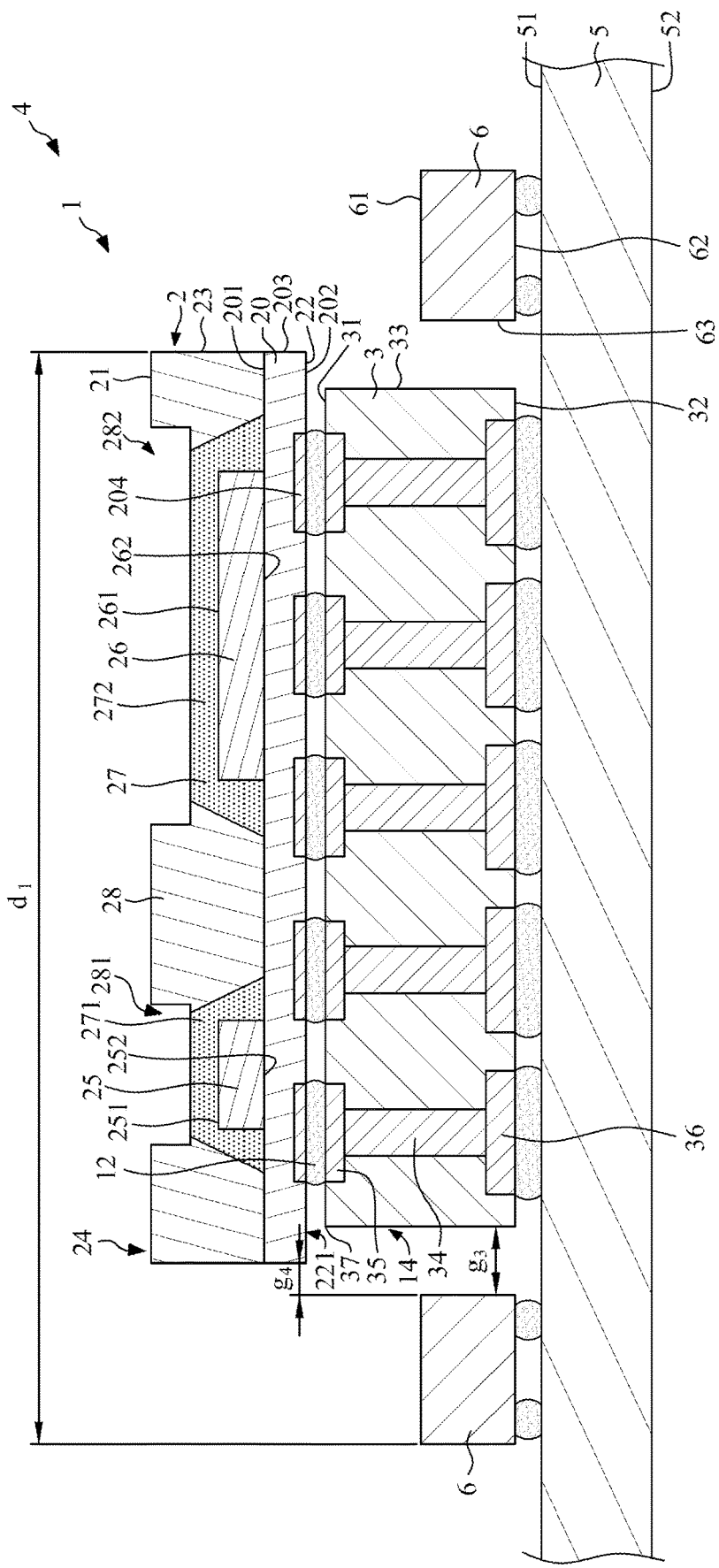
FIG. 4 illustrates a cross-sectional view of an assembly structure according to some embodiments of the present disclosure.

FIG. 4 illustrates a cross-sectional view of an assembly structure 4 according to some embodiments of the present disclosure. The assembly structure 4 may include a substrate 5, an optical device 1 (including an electrical component 3 and an optical component 2) and an element 6. The substrate 5 may be a carrier (e.g., a mother board such as a printed circuit board (PCB)). The substrate 5 may have a first surface 51 (e.g., a top surface) and a second surface 52 (e.g., a bottom surface) opposite to the first surface 51.

The optical device 1 of FIG. 4 may be same as or similar to the optical device 1 of FIG. 1 to FIG. 3. Thus, the electrical component 3 and the optical component 2 of FIG. 4 may be same as or similar to the electrical component 3 and the optical component 2 of FIG. 1 to FIG. 3, respectively. The electrical component 3 may be disposed on and electrically connected to the first surface 51 of the substrate 5. The optical component 2 may be disposed on and electrically connected to the electrical component 3. A vertical projection of the electrical component 3 on the first surface 51 of the substrate 5 is within a vertical projection of the optical component 2 on the first surface 51 of the substrate 5.

The element 6 may be disposed on and electrically connected to the first surface 51 of the substrate 5, and disposed adjacent to the electrical component 3. The element 6 may be an active component, a passive component, a semiconductor package, a semiconductor die or a semiconductor chip. The element 6 may have a first surface 61 (e.g., a top surface), a second surface 62 (e.g., a bottom surface) opposite to the first surface 61, and at least one lateral surface 63 extending between the first surface 61 and the second surface 62.

As shown in FIG. 4, a third horizontal gap $g_3$ between the element 6 and the electrical component 3 may be greater than a fourth horizontal gap $g_4$ between the element 6 and the optical component 2. The fourth horizontal gap $g_4$ may be equal to a gap between the lateral surface 63 of the element 6 and a vertical extension of the lateral surface 23 of the optical component 2. Thus, the element 6 is closer to the vertical extension of the lateral surface 23 of the optical component 2 than to the electrical component 3. The element 6 may be disposed at a location closer to the optical device 1 due to the indentation structure 14. A size of a combination of the element 6 and the optical device 1 may be determined by the lateral surface 23 of the optical component 2 opposite to the element 6 and the lateral surface 63 of the element 6 opposite to the optical device 1. As shown in FIG. 4, the combination of the element 6 and the optical device 1 may have a relatively small size and may occupy a small footprint of the substrate 5. For example, a first distance $d_1$ between the lateral surface 23 of the optical component 2 opposite to the element 6 and the lateral surface 63 of the element 6 opposite to the optical device 1 may be relatively small.

Figure 5:
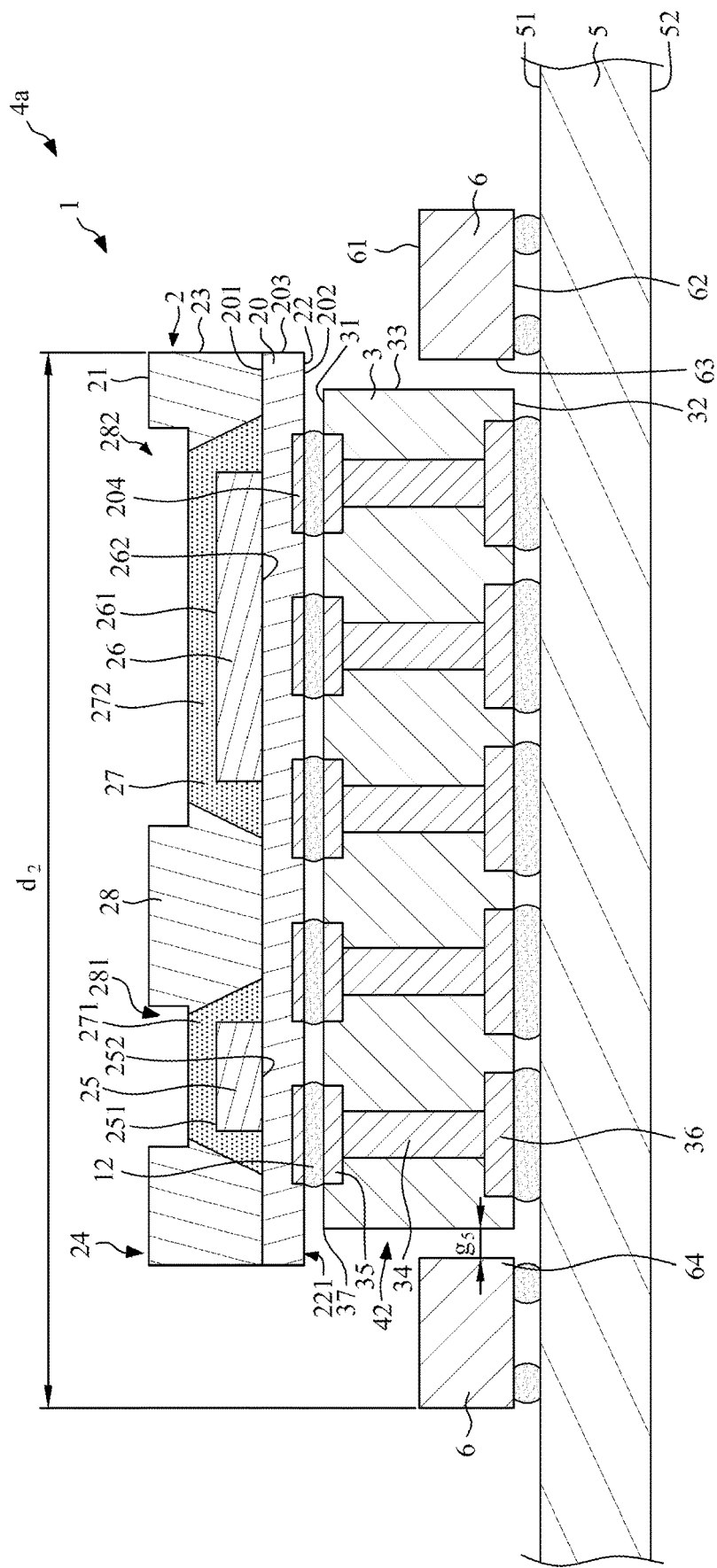
FIG. 5 illustrates a cross-sectional view of an assembly structure according to some embodiments of the present disclosure.

FIG. 5 illustrates a cross-sectional view of an assembly structure 4a according to some embodiments of the present disclosure. The assembly structure 4a may be similar to the assembly structure 4 of FIG. 4, except that the element 6 is further closer to the electrical component 3. A fifth horizontal gap $g_5$ between the element 6 and the electrical component 3 may be less than the third horizontal gap $g_3$ of FIG. 4. An accommodating space 42 may be defined by a bottom surface 22 (i.e., the exposed portion 221 of the backside surface 22) of the optical component 2, a lateral surface 33 of the electrical component 3 and the top surface 51 (i.e., the first surface 51) of the substrate 5. That is, the electrical component 3 may raise the optical component 2 to form the accommodating space 42. At least a portion 61 of the element 6 may be disposed or accommodated in the accommodating space 42. Thus, the portion 61 of the element 6 may be disposed under the exposed portion 221 of the backside surface 22 of the optical component 2, and the vertical projection of the optical component 2 may overlap the element 6. As shown in FIG. 5, the combination of the element 6 and the optical device 1 may have a smaller size than the combination of FIG. 4. For example, a second distance $d_2$ between the lateral surface 23 of the optical component 2 opposite to the element 6 and the lateral surface 63 of the element 6 opposite to the optical device 1 may be less than the first distance $d_1$ of FIG. 4.

Figure 6:
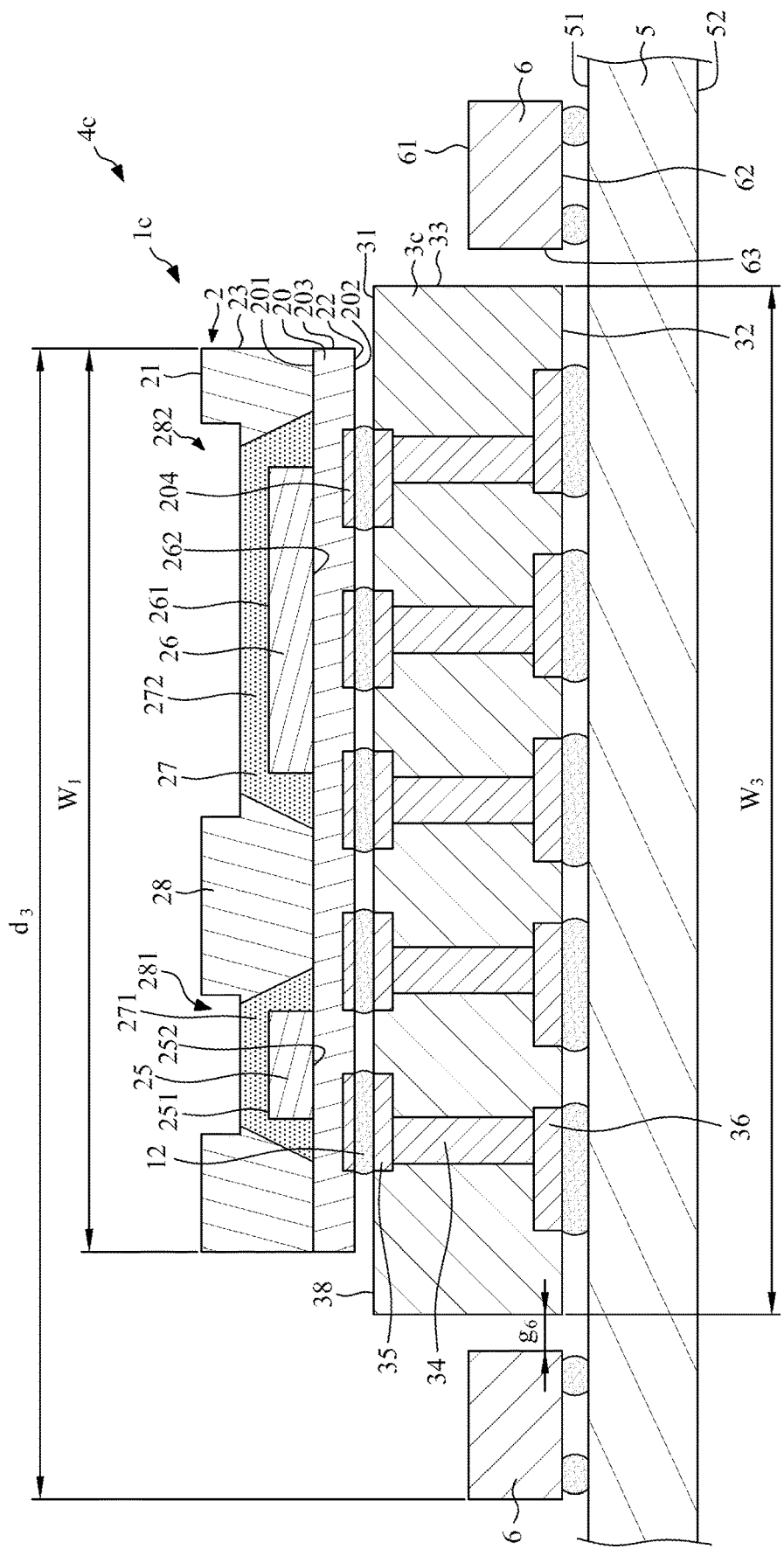
FIG. 6 illustrates a cross-sectional view of an assembly structure according to a comparative embodiment of the present disclosure.

FIG. 6 illustrates a cross-sectional view of an assembly structure 4c according to a comparative embodiment of the present disclosure. The assembly structure 4c may be similar to the assembly structure 4 of FIG. 4, except that the structure of the electrical component 3c of the optical device 1c. The optical component 2 of FIG. 6 may be same as or similar to the optical component 2 of FIG. 1 to FIG. 3. The electrical component 3c may be similar to the electrical component 3 of FIG. 1 to FIG. 3, except that a width $W_3$ of the electrical component 3c may be greater than the width $W_2$ of the electrical component 3 of FIG. 1 to FIG. 3. As shown FIG. 6, the width $W_3$ of the electrical component 3c may be greater than the width $W_1$ of the optical component 2. Thus, a portion 38 of the first surface 31 of the electrical component 3 may be exposed from the optical component 2. The exposed portion 38 of the first surface 31 of the electrical component 3 may be not covered by the optical component 2 in a vertical direction. A vertical projection of the optical component 2 on the first surface 51 of the substrate 5 is within a vertical projection of the electrical component 3 on the first surface 51 of the substrate 5. As shown in FIG. 6, a sixth horizontal gap $g_6$ between the element 6 and the electrical component 3c may be equal to the third horizontal gap $g_3$ of FIG. 4 or the fifth horizontal gap $g_5$ of FIG. 5.

A size of a combination of the element 6 and the optical device 1c may be determined by the lateral surface 23 of the optical component 2 opposite to the element 6 and the lateral surface 63 of the element 6 opposite to the optical device 1c. As shown in FIG. 6, the combination of the element 6 and the optical device 1c may have a relatively large size and may occupy a large footprint of the substrate 5. For example, a third distance $d_3$ between the lateral surface 23 of the optical component 2 opposite to the element 6 and the lateral surface 63 of the element 6 opposite to the optical device 1c may be greater than the first distance $d_1$ of FIG. 4 and the second distance $d_2$ of FIG. 5. In other words, the first distance $d_1$ of FIG. 4 and the second distance $d_2$ of FIG. 5 may be less than the third distance $d_3$ of FIG. 6. Thus, a number of the elements 6 in FIG. 4 and FIG. 5 may be greater than a number of the elements 6 in a same area of the substrate 5. Thus, a design flexibility of the assembly structure 4 of FIG. 4 or the assembly structure 4a of FIG. 5 may be increased.

Figure 7:
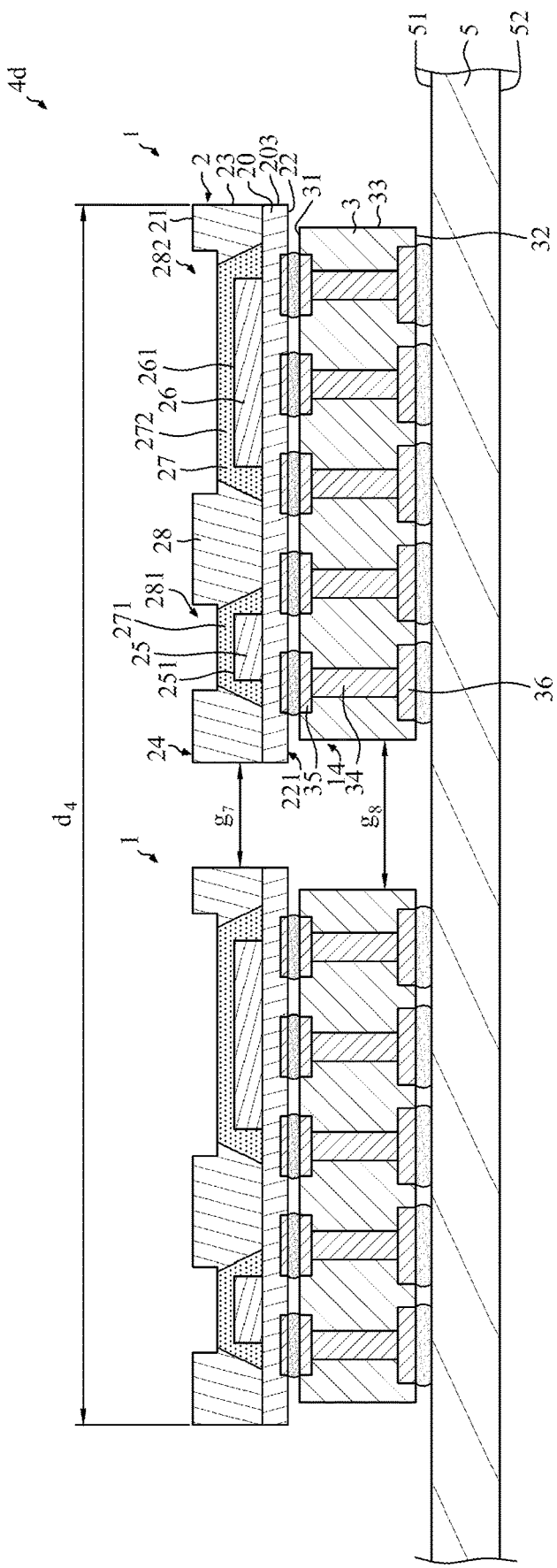
FIG. 7 illustrates a cross-sectional view of an assembly structure according to some embodiments of the present disclosure.

FIG. 7 illustrates a cross-sectional view of an assembly structure 4d according to some embodiments of the present disclosure. The assembly structure 4d may be similar to the assembly structure 4 of FIG. 4, except that the element 6 of FIG. 4 may be replaced by an optical device 1. That is, at least two optical devices 1 may be disposed side by side on the substrate 5. A seventh horizontal gap $g_7$ may be between the optical components 2 of the two optical devices 1. An eighth horizontal gap $g_5$ may be between the electrical components 3 of the two optical devices 1. The seventh horizontal gap $g_7$ may be less than the eighth horizontal gap $g_5$. A size of a combination of the two optical devices 1 may be determined by the outermost lateral surfaces 23 of the optical components 2 opposite to each other. As shown in FIG. 7, the combination of the two optical devices 1 may have a relatively small size and may occupy a small footprint of the substrate 5. For example, a fourth distance $d_4$ between the outermost lateral surfaces 23 of the optical components 2 opposite to each other may be relatively small.

Figure 8:
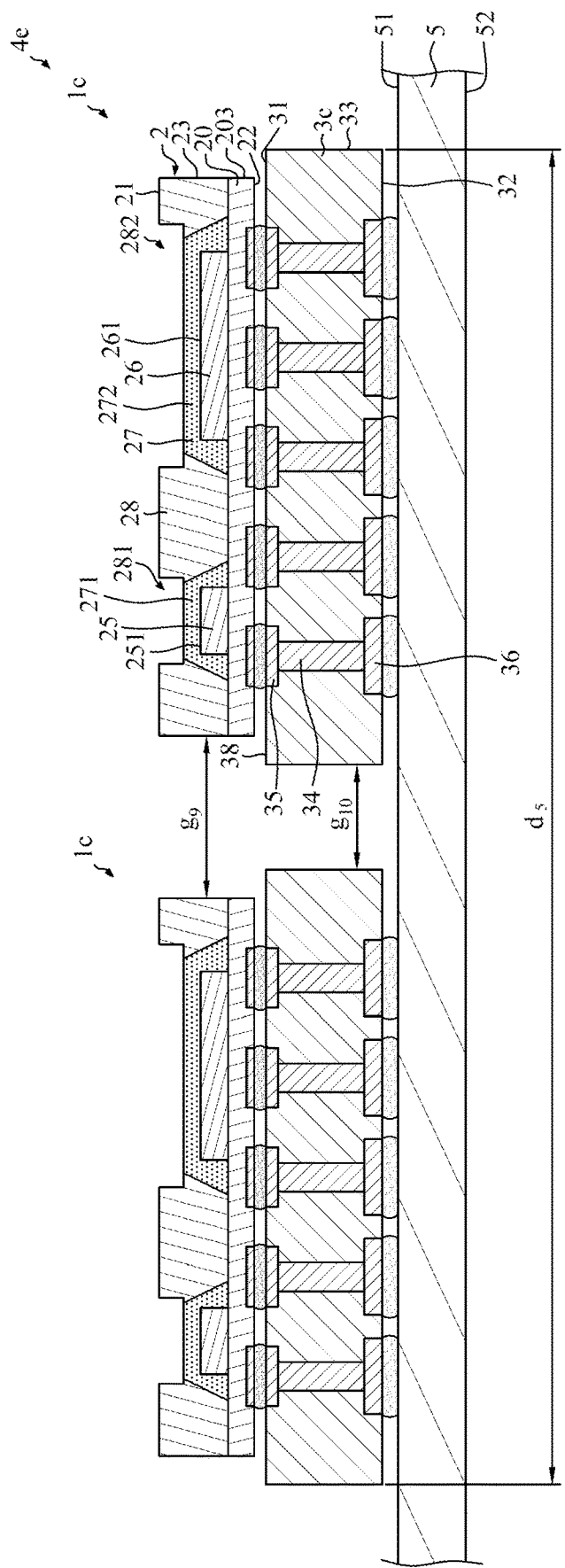
FIG. 8 illustrates a cross-sectional view of an assembly structure according to a comparative embodiment of the present disclosure.

FIG. 8 illustrates a cross-sectional view of an assembly structure 4e according to a comparative embodiment of the present disclosure. The assembly structure 4e may be similar to the assembly structure 4c of FIG. 6, except that the element 6 of FIG. 6 may be replaced by an optical device 1c. That is, at least two optical devices 1c may be disposed side by side on the substrate 5. A ninth horizontal gap $g_9$ may be between the optical components 2 of the two optical devices 1c. A tenth horizontal gap $g_{10}$ may be between the electrical components 3c of the two optical devices 1c. The ninth horizontal gap $g_9$ may be greater than the tenth horizontal gap $g_{10}$. A size of a combination of the two optical devices 1c may be determined by the outermost lateral surfaces 33 of the electrical components 3c opposite to each other. As shown in FIG. 8, the combination of the two optical devices 1c may have a relatively large size and may occupy a large footprint of the substrate 5. For example, a fifth distance $d_5$ between the outermost lateral surfaces 33 of the electrical components 3c opposite to each other may be relatively large. In comparison, the tenth horizontal gap $g_{10}$ of FIG. 8 may be substantially equal to the seventh horizontal gap $g_7$ of FIG. 7, and the fourth distance $d_4$ of FIG. 7 may be less than the fifth distance $d_5$ of FIG. 8. A number of the optical devices 1 may be greater than a number of the optical devices 1c in a same area of the substrate 5. Thus, a design flexibility of the assembly structure 4d of FIG. 7 may be increased.

Figure 9:
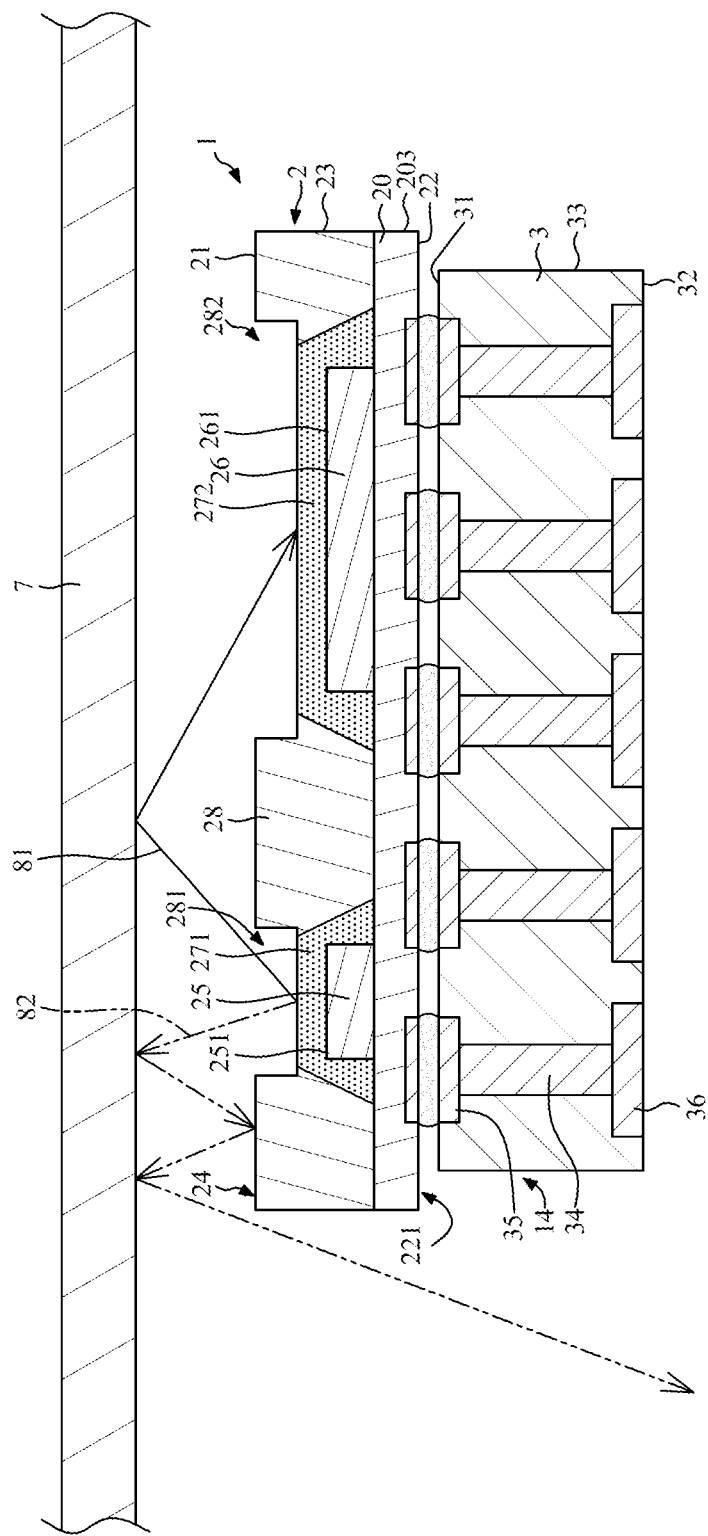
FIG. 9 illustrates an operation state of the optical device of FIG. 1 to FIG. 3.

FIG. 9 illustrates an operation state of the optical device 1 of FIG. 1 to FIG. 3. An object 7 may be located or disposed adjacent to the sensing surface 21 of the optical component 2. For example, the object 7 may be disposed above the sensing surface 21 of the optical component 2. That is, the sensing surface 21 of the optical component 2, the first surface 251 (e.g., the light emitting area) of the light emitting component 25 and the first surface 261 (e.g., the light receiving area) of the light receiving component 26 may face the object 7. During operation, a plurality of light beams (including, for example, a first light beam 81 and a second light beam 82) generated by the light emitting component 25 may be emitted out from the first surface 251 (e.g., the light emitting area) of the light emitting component 25 through the first opening 281. The first light beam 81 may be reflected by the object 7, and then reach or enter to the first surface 261 (e.g., the light receiving area) of the light receiving component 26 through the second opening 282. Thus, the first light beam 81 may be a desired light beam or a correct light beam that can be detected by the light receiving component 26. In addition, the second light beam 82 may be reflected by the object 7, the light shielding structure 28 and the object 7, and then forward to a space outside the optical device 1. The second light beam 82 will not reach or enter to the first surface 261 (e.g., the light receiving area) of the light receiving component 26. Thus, the second light beam 82 may be not detected by the light receiving component 26. In addition, any undesired light beam or an incorrect light beam (except for the second light beam 82) that comes from the object 7 will not reach or enter to the first surface 261 (e.g., the light receiving area) of the light receiving component 26. As shown in FIG. 9, since the width $W_2$ of the electrical component 3 is less than the width $W_1$ of the optical component 2 (FIG. 2), the second light beam 82 will not be reflected back to the light receiving component 26 through the electrical component 3 to become an undesired noise. Therefore, the electrical component 3 is configured to reduce or avoid a light beam reflected from the object 7 and then reflected by the electrical component 3. That is, the size difference between the electrical component 3 and the optical component 2 may reduce or avoid a light beam coming from the object 7 to be reflected by the electrical component 3. It is noted that some embodiments that a vertical projection of the electrical component 3 is within a vertical projection of the optical component 2 (e.g., the size of the electrical component 3 is less than or equal to the size of the optical component 2) may also achieve such effect. Therefore, the sensing accuracy of the optical device 1 may be improved due to the reduction of noise.

Figure 10:
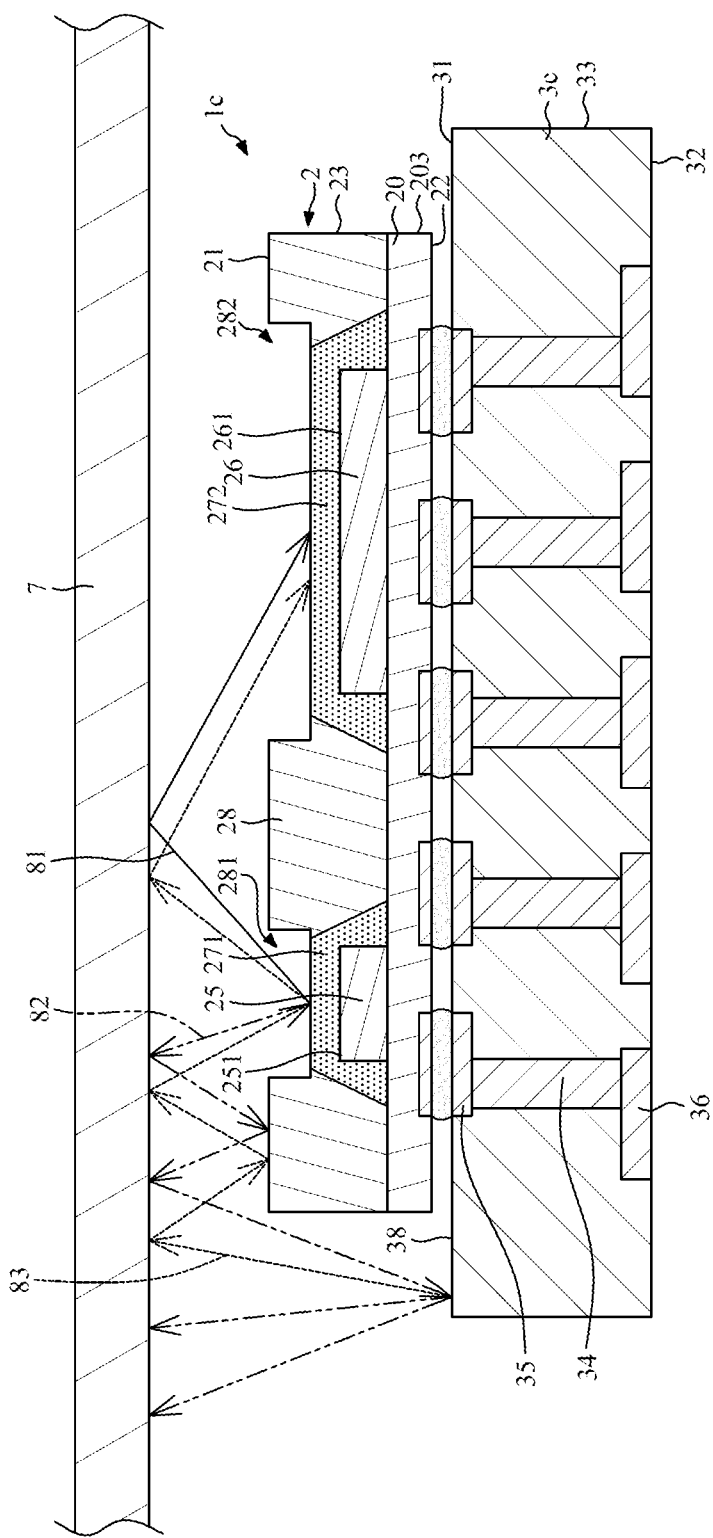
FIG. 10 illustrates an operation state of the optical device of FIG. 6.

FIG. 10 illustrates an operation state of the optical device 1c of FIG. 6. The operation state (or distribution of light path) of the optical device 1c may be similar to the operation state of the optical device 1 of FIG. 9, except that the second light beam 82 may be reflected by the portion 38 of the first surface 31 of the electrical component 3c. A portion of the reflected second light beam 82 may become a third light beam 83 that is reflected back or transmitted back to the optical device 1c. As shown in FIG. 10, the third light beam 83 may be further reflected by the object 7 and the light shielding structure 28, and may reach or enter to the first surface 251 (e.g., the light emitting area) of the light emitting component 25 and/or the first surface 261 (e.g., the light receiving area) of the light receiving component 26. Such third light beam 83 may be an undesired light beam or an incorrect light beam, and may be a noise. Referring back to FIG. 9, such noise caused by the third light beam 83 may be reduced or avoided. For example, in a first simulation condition corresponding to FIG. 9, the width $W_1$ of the optical component 2 (FIG. 2) is greater than the width $W_2$ of the electrical component 3 (FIG. 2) by 200 μm. That is, each of the four lateral surfaces 33 of the electrical component 3 is recessed from each of the four lateral surfaces 23 of the optical component 2 by 100 μm. After simulation, the first simulation condition results in a first percentage of optical noise. Further, in a second simulation condition corresponding to FIG. 10, the width of the optical component 2 is less than the width of the electrical component 3c by 400 μm. That is, each of the four lateral surfaces 33 of the electrical components 3c protrudes from each of the four lateral surfaces 23 of the optical component 2 by 200 μm. After simulation, the second simulation condition results in a second percentage of optical noise. The first percentage of optical noise is less than the second percentage of optical noise by at least 0.1% of optical noise. Therefore, the sensing accuracy of the optical device 1 of FIG. 9 may be improved due to the reduction of optical noise, so as to avoid misjudgement or false positive.

Figure 11:
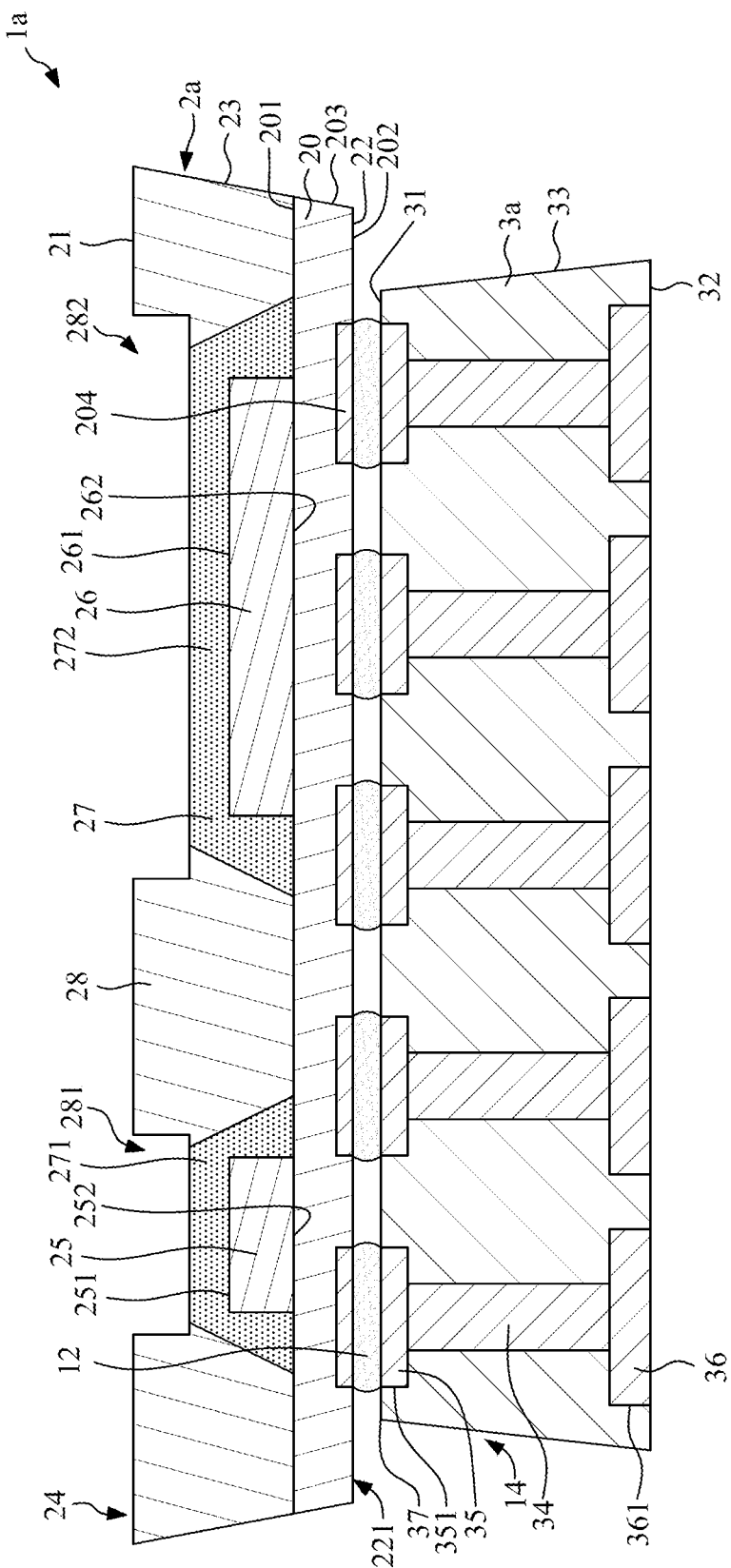
FIG. 11 illustrates a cross-sectional view of an optical device according to some embodiments of the present disclosure.

FIG. 11 illustrates a cross-sectional view of an optical device 1a according to some embodiments of the present disclosure. The optical device 1a may be similar to the optical device 1 of FIG. 1 to FIG. 3, except for the structures of the optical component 2a and the electrical component 3a. The optical component 2a may be similar to the optical component 2 of FIG. 2, except that the width of the optical component 2a may decrease toward the electrical component 3a. Thus, the optical component 2a may taper toward the electrical component 3a. In addition, the electrical component 3a may be similar to the electrical component 3 of FIG. 2, except that the width of the electrical component 3a may decrease toward the optical component 2a. Thus, the electrical component 3a may taper toward the optical component 2a.

Figure 12:
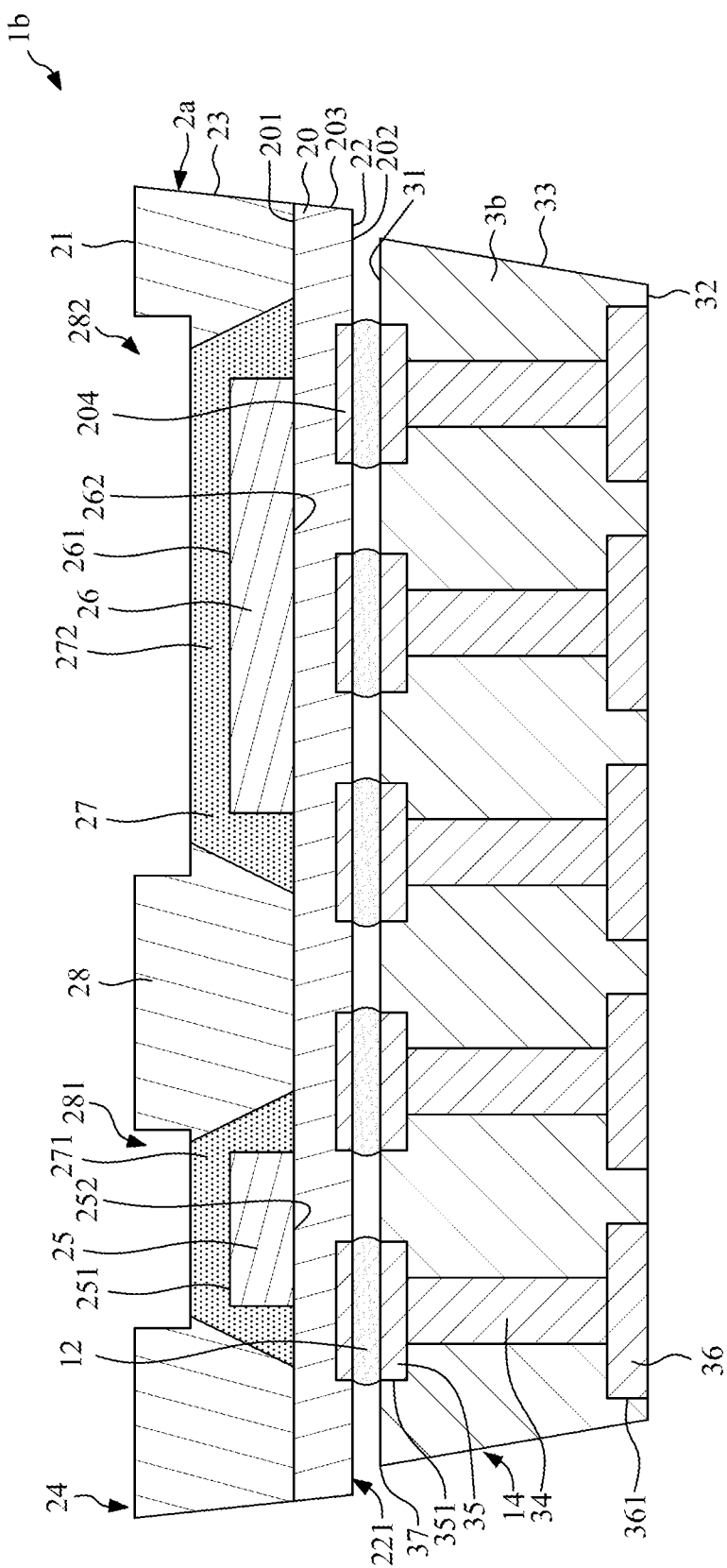
FIG. 12 illustrates a cross-sectional view of an optical device according to some embodiments of the present disclosure.

FIG. 12 illustrates a cross-sectional view of an optical device 1b according to some embodiments of the present disclosure. The optical device 1b may be similar to the optical device 1a of FIG. 11, except for the structure of the electrical component 3b. The width of the electrical component 3b may increase toward the optical component 2a. Thus, the electrical component 3b may taper away from the optical component 2a. In the embodiment illustrated in FIG. 12, less undesired light beam will reach or enter to the first surface 261 (e.g., the light receiving area) of the light receiving component 26 due to the inclination of the lateral surfaces 33 of the electrical component 3b.

FIG. 13 through FIG. 21 illustrate a method for manufacturing an optical device according to some embodiments of the present disclosure. In some embodiments, the method is for manufacturing the optical device 1 shown in FIG. 1 to FIG. 3.

Figure 13:
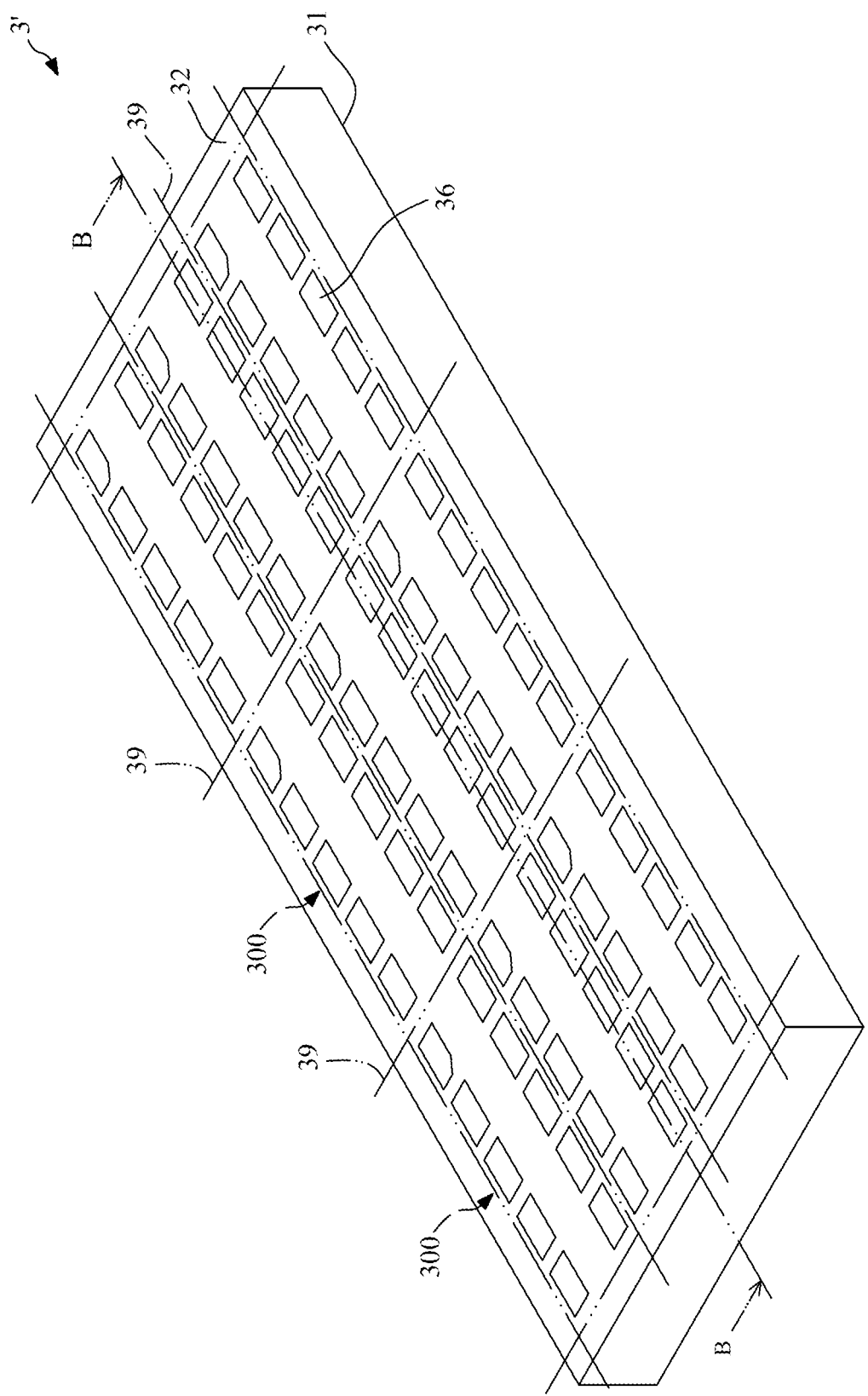
FIG. 13 illustrates one or more stages of an example of a method for manufacturing an optical device according to some embodiments of the present disclosure.
Figure 14:
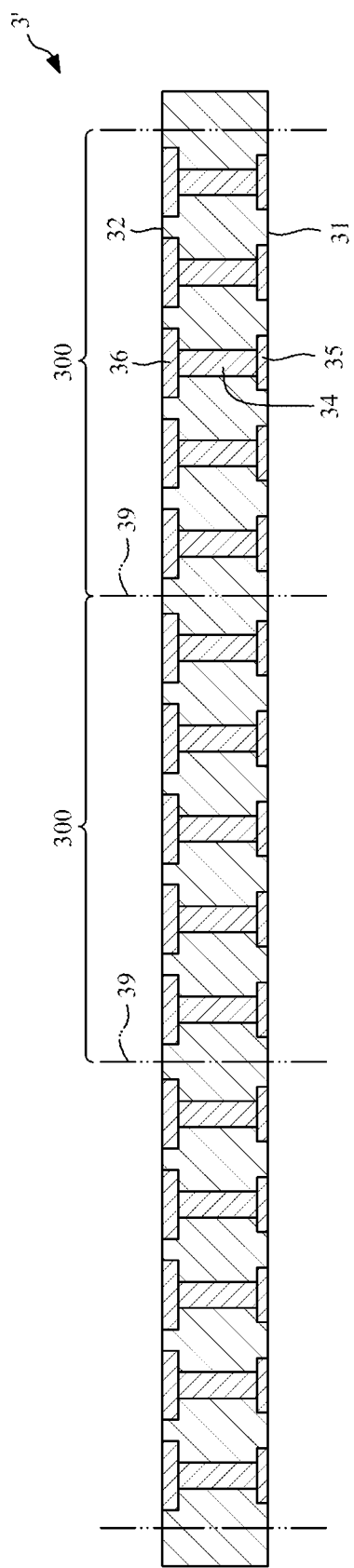
FIG. 14 illustrates one or more stages of an example of a method for manufacturing an optical device according to some embodiments of the present disclosure.

Referring to FIG. 13 and FIG. 14, a substrate 3' is provided. FIG. 13 illustrates a perspective view of the substrate 3' according to some embodiments of the present disclosure. FIG. 14 illustrates a cross-sectional view taken along line B-B of the substrate 3' of FIG. 13. The substrate 3' may be an electrical structure, and may have a plurality of singulation lines 39 (e.g., cutting lines) crossed with each other to define a plurality of electrical units 300. Each of the electrical units 300 of FIG. 13 and FIG. 14 may be similar to or same as the electrical component 3 of FIG. 1 and FIG. 2. However, the orientation of the electrical unit 300 of FIG. 13 and FIG. 14 may be different from the orientation of the electrical component 3 of FIG. 1 and FIG. 2.

Figure 15:
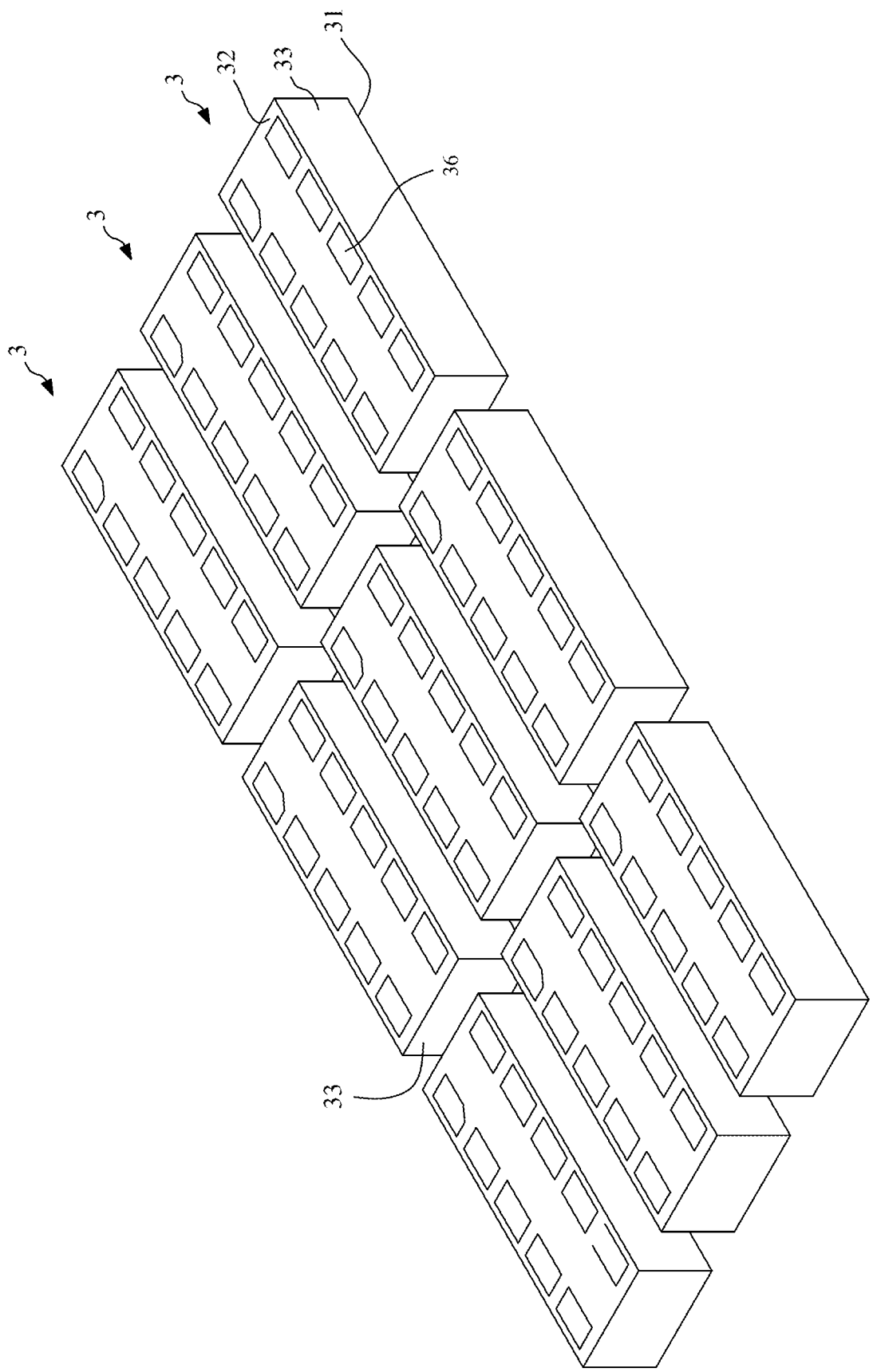
FIG. 15 illustrates one or more stages of an example of a method for manufacturing an optical device according to some embodiments of the present disclosure.

Referring to FIG. 15, the substrate 3' may be singulated to form a plurality of electrical components 3.

Figure 16:
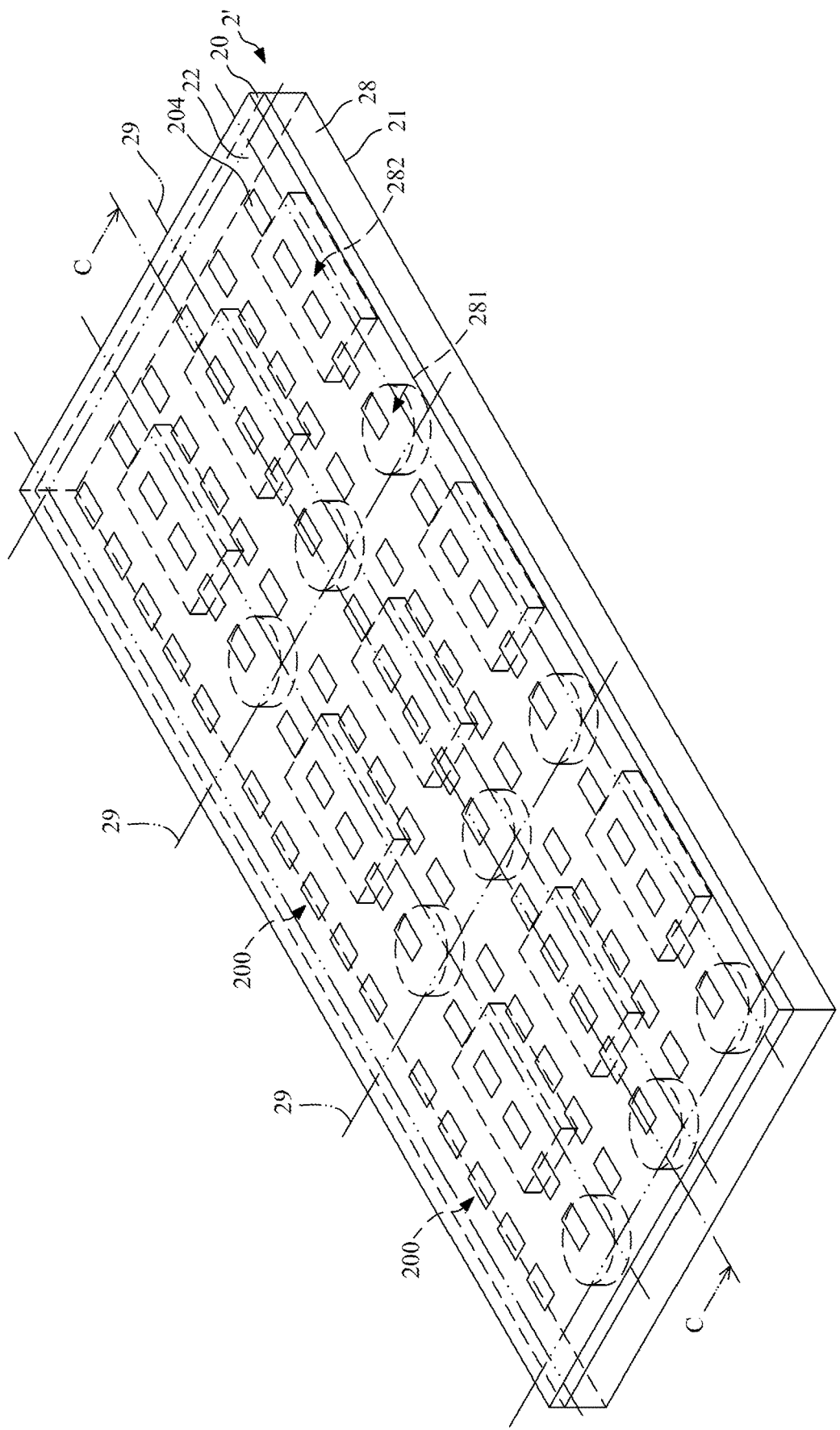
FIG. 16 illustrates one or more stages of an example of a method for manufacturing an optical device according to some embodiments of the present disclosure.
Figure 17:
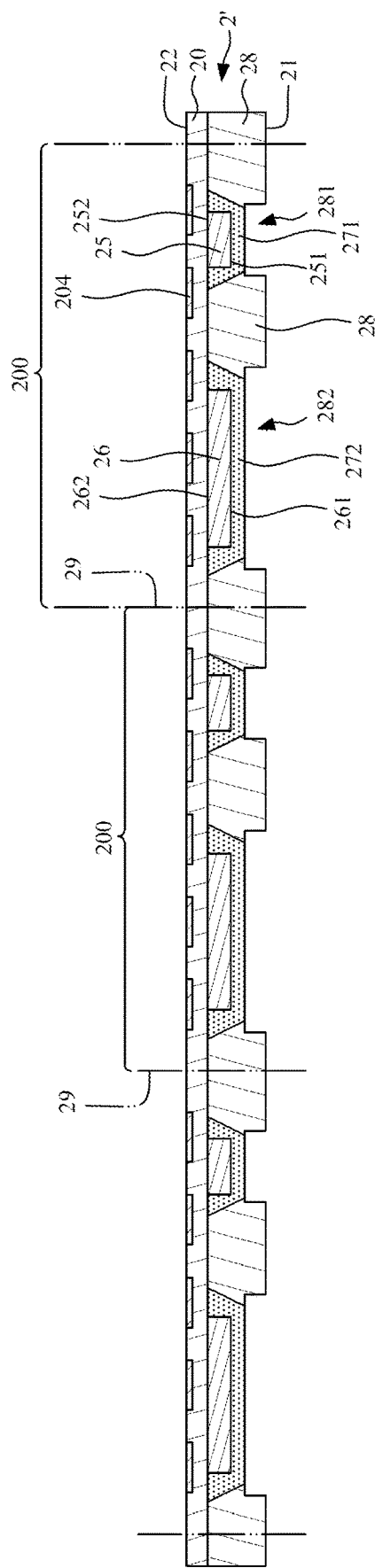
FIG. 17 illustrates one or more stages of an example of a method for manufacturing an optical device according to some embodiments of the present disclosure.

Referring to FIG. 16 and FIG. 17, an optical structure 2' is provided. FIG. 16 illustrates a perspective view of the optical structure 2' according to some embodiments of the present disclosure. FIG. 17 illustrates a cross-sectional view taken along line C-C of the optical structure 2' of FIG. 16. The optical structure 2' may have a sensing surface 21 (e.g., a first surface) and a backside surface 22 (e.g., a second surface) opposite to the sensing surface 21. The optical structure 2' may include a substrate 20 and a light shielding structure 28 disposed on the substrate 20. In some embodiments, the substrate 20 may include a plurality of bonding pads 204 exposed from the backside surface 22. The light shielding structure 28 may define a plurality of first openings 281 and a plurality of second openings 282 recessed from the sensing surface 21. The first opening 281 may correspond to a light emitting area of a light emitting component. The second opening 282 may correspond to a light receiving area of a light receiving component. In addition, the optical structure 2' may have a plurality of singulation lines 29 crossed with each other to define a plurality of optical units 200. Each of the optical units 200 of FIG. 16 and FIG. 17 may be similar to or same as the optical component 2 of FIG. 1 and FIG. 2. However, the orientation of the optical unit 200 of FIG. 16 and FIG. 17 may be different from the orientation of the optical component 2 of FIG. 1 and FIG. 2. The optical unit 200 may have a sensing surface 21 (e.g., a first surface) and a backside surface 22 (e.g., a second surface) opposite to the sensing surface 21.

Figure 18:
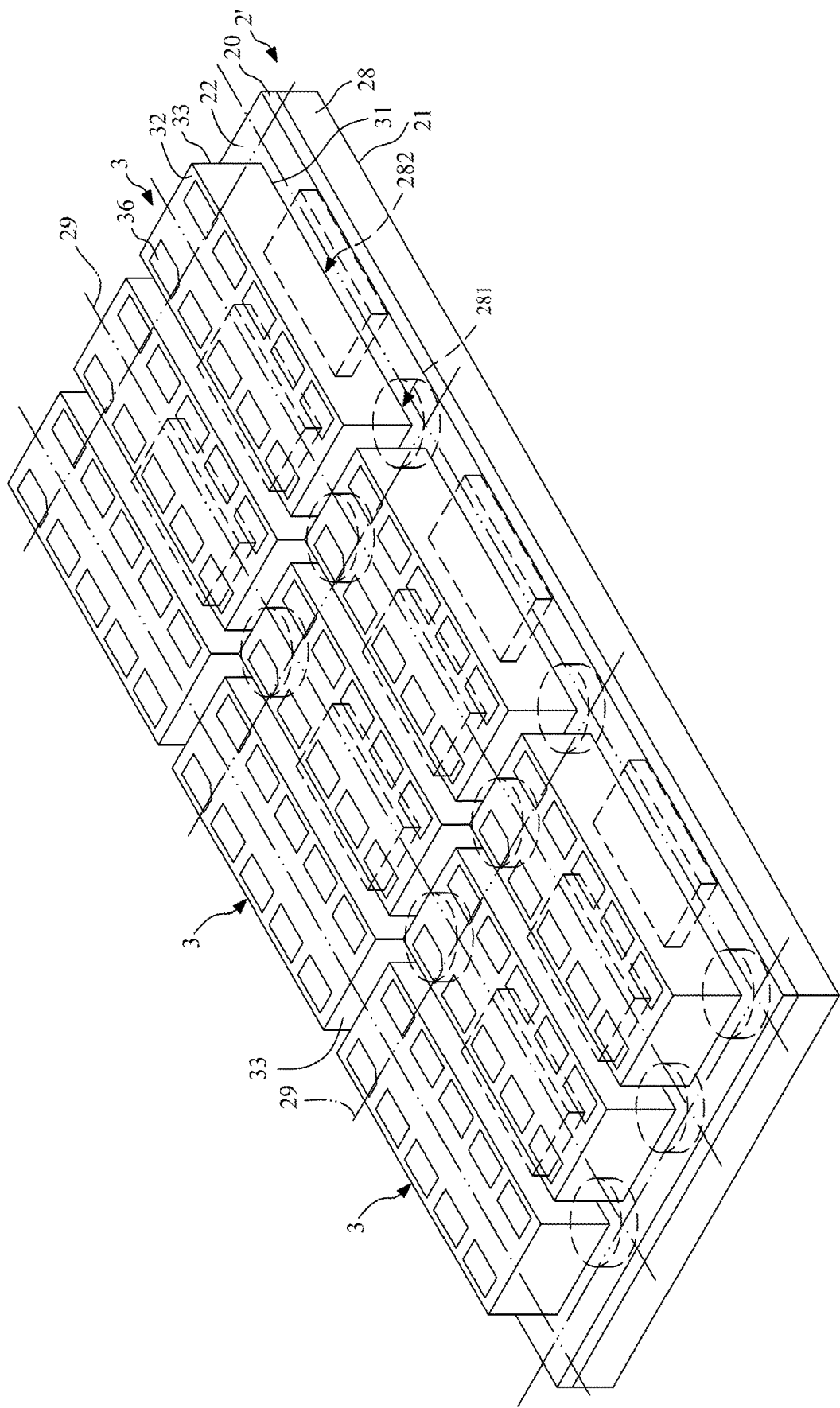
FIG. 18 illustrates one or more stages of an example of a method for manufacturing an optical device according to some embodiments of the present disclosure.
Figure 19:
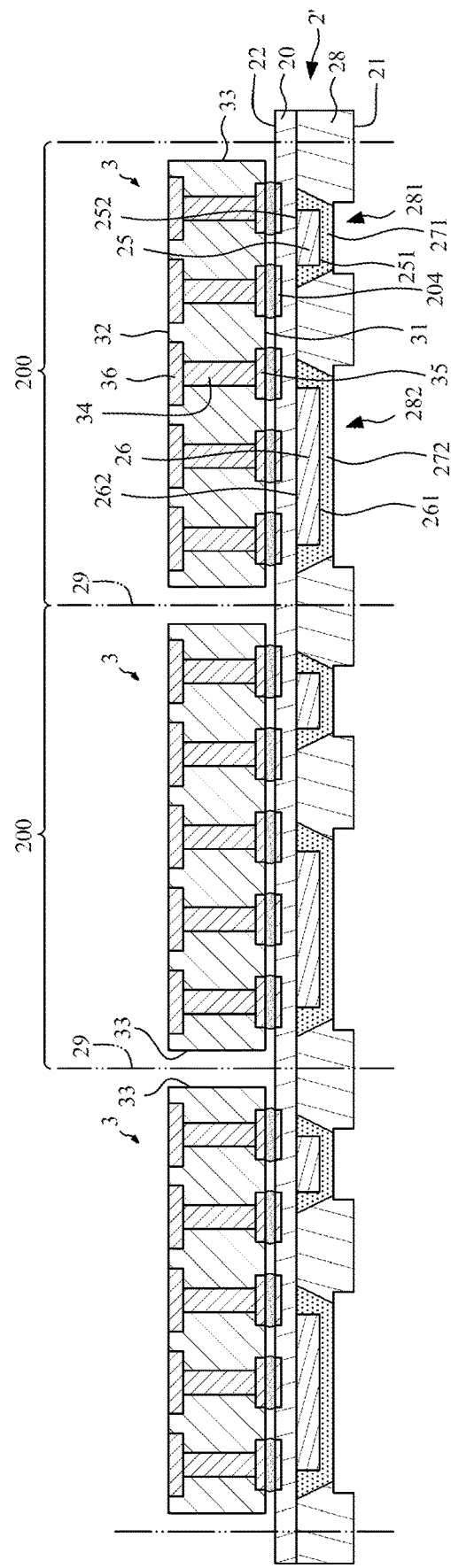
FIG. 19 illustrates one or more stages of an example of a method for manufacturing an optical device according to some embodiments of the present disclosure.

Referring to FIG. 18 and FIG. 19, the electrical components 3 of FIG. 15 may be disposed on the backside surface 22 (e.g., a second surface) of the optical structure 2'. FIG. 18 illustrates a perspective view of the electrical components 3 and the optical structure 2' according to some embodiments of the present disclosure. FIG. 19 illustrates a cross-sectional view of the electrical components 3 and the optical structure 2' of FIG. 18. The electrical component 3 may be disposed on the backside surface 22 of the optical unit 200. For example, the first bonding pad 35 of the electrical component 3 may be physically connected and/or electrically connected to the bonding pad 204 of the substrate 20 of the optical unit 200 through a surface-mount technology (SMT). Further, the singulation lines 29 of the optical structure 2' may be located between the lateral surfaces 33 of adjacent electrical components 3. In the illustrated method, the electrical components 3 of FIG. 15 may be tested, and only known good electrical component 3 may be disposed on the optical unit 200. An unqualified electrical component 3 will be discarded, thus will not consume the expensive optical unit 200 of the optical structure 2'. Therefore, the manufacture cost may be reduced. In addition, in a top view, a size of each of the electrical components 3 may be smaller than a size of each of the optical units 200. That is, a vertical projection of the electrical component 3 is within the optical unit 200 of the optical structure 2'.

Figure 20:
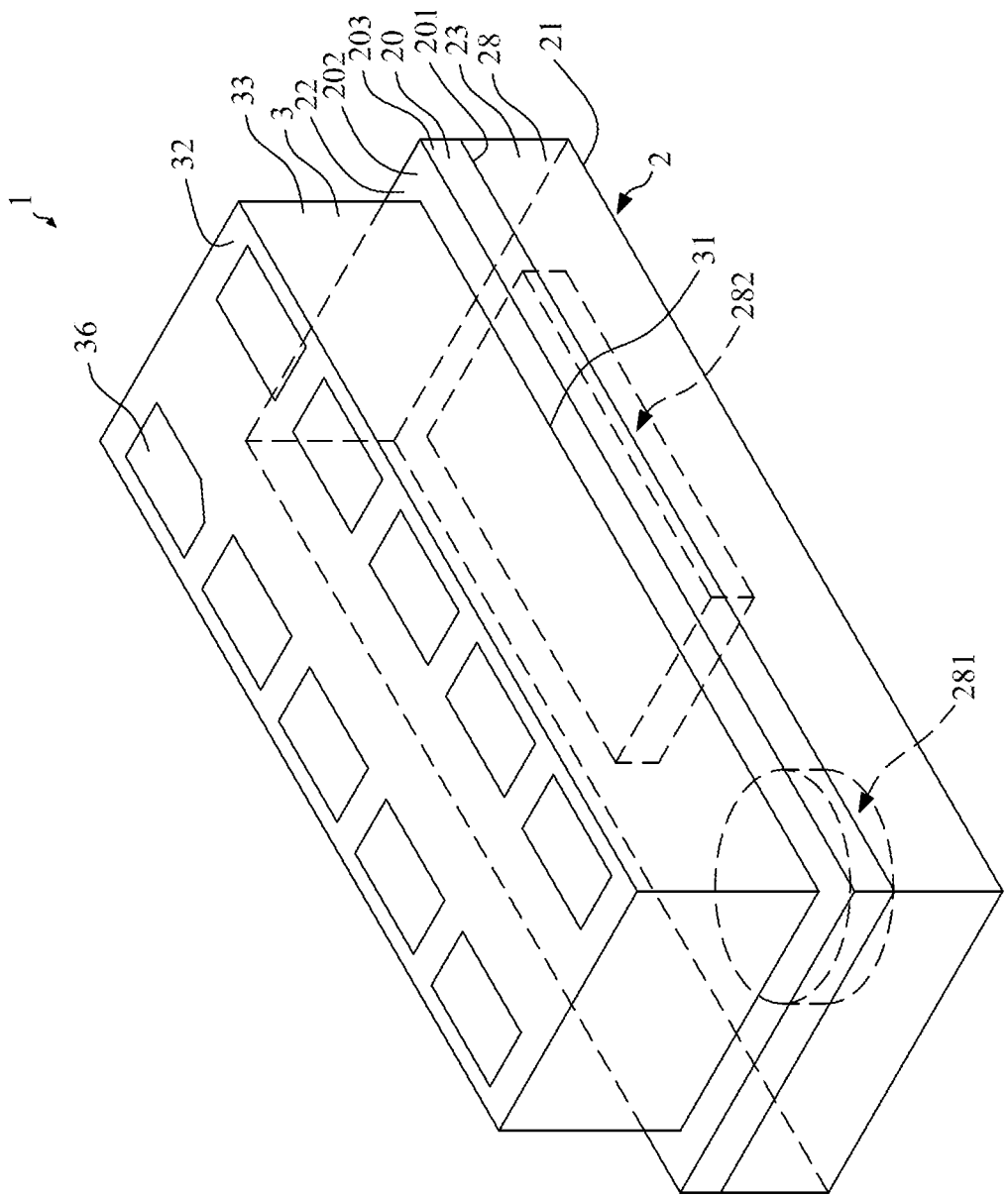
FIG. 20 illustrates one or more stages of an example of a method for manufacturing an optical device according to some embodiments of the present disclosure.
Figure 21:
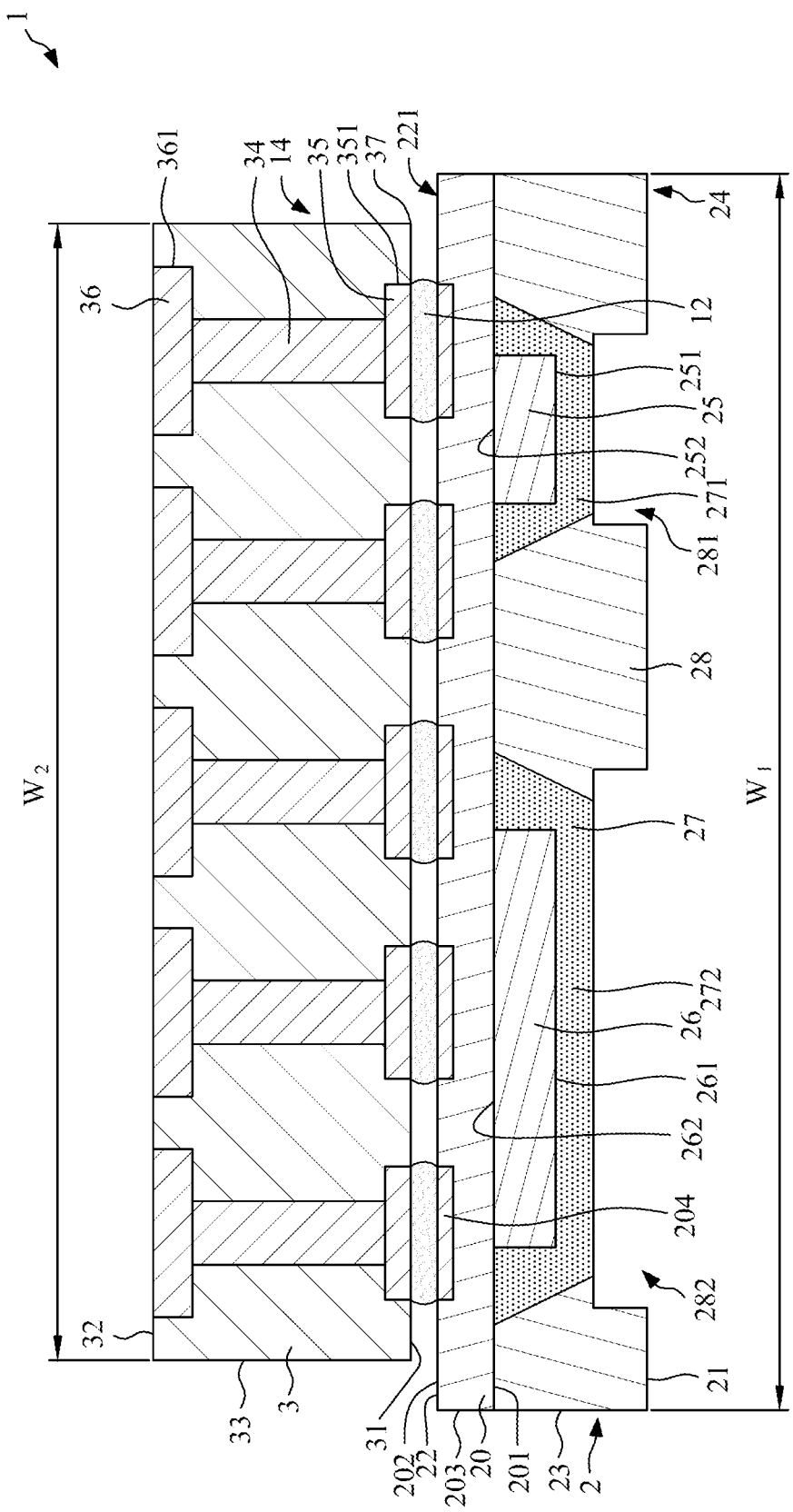
FIG. 21 illustrates one or more stages of an example of a method for manufacturing an optical device according to some embodiments of the present disclosure.

Referring to FIG. 20 and FIG. 21, the optical structure 2' may be singulated to form a plurality of optical devices 1. FIG. 20 illustrates a perspective view of the optical device 1 according to some embodiments of the present disclosure. FIG. 21 illustrates a cross-sectional view of the optical device 1 of FIG. 20. The optical device 1 of FIG. 20 and FIG. 21 may be similar to or same as the optical device 1 of FIG. 1 to FIG. 3. However, the orientation of the optical device 1 of FIG. 20 and FIG. 21 may be different from the orientation of the optical device 1 of FIG. 1 to FIG. 3. In some embodiments, the singulation process may be conducted from the backside surface 22 (e.g., a second surface) of the optical structure 2'. That is, the optical structure 2' may be singulated from the backside surface 22 of the optical structure 2' toward the sensing surface 21 of the optical structure 2' or from the backside surfaces 22 of the optical units 200 toward the sensing surfaces 21 of the optical units 200.

In a comparative embodiment, a singulated electrical component 3 may be bonded to a singulated optical component 2 one by one. However, a shift or a misalignment between the singulated electrical component 3 and the singulated optical component 2 may occur during the bonding process. Thus, such manufacturing method may have a relative low yield rate, and may be time-consuming and costly. In comparison, in the method illustrated in FIG. 13 through FIG. 21, after a plurality of the singulated electrical components 3 are reconstituted or rearranged on the optical structure 2', and then the optical structure 2' is singulated. Thus, a shift or a misalignment between the singulated electrical components 3 and the optical units 200 of the optical structure 2' may be reduced or avoided. As a result, the method may have a relative high yield rate, and may reduce the manufacturing time and manufacturing cost.

Figure 22:
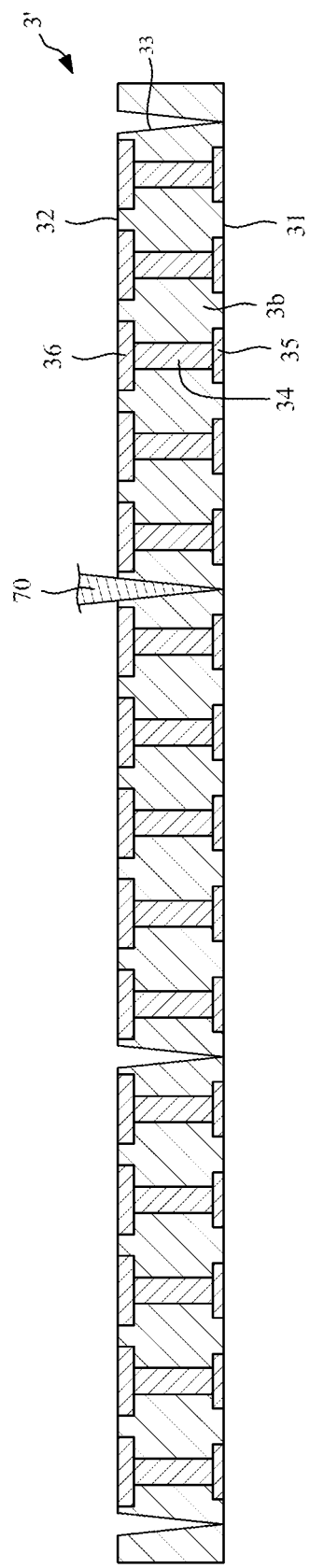
FIG. 22 illustrates one or more stages of an example of a method for manufacturing an optical device according to some embodiments of the present disclosure.
Figure 23:
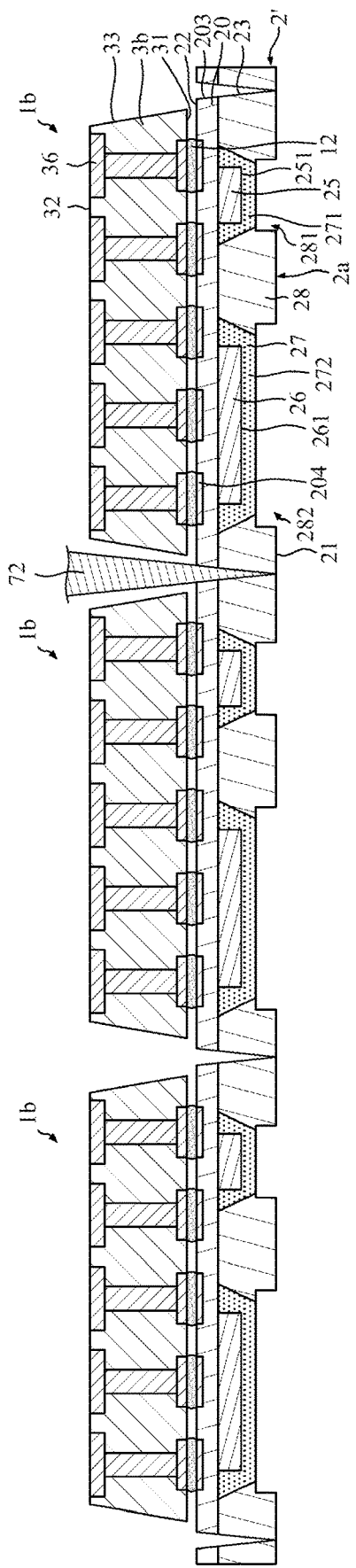
FIG. 23 illustrates one or more stages of an example of a method for manufacturing an optical device according to some embodiments of the present disclosure.

FIG. 22 through FIG. 23 illustrate a method for manufacturing an optical device according to some embodiments of the present disclosure. In some embodiments, the method is for manufacturing the optical device 1b shown in FIG. 12. The initial stages of the illustrated process are the same as, or similar to, the stages illustrated in FIG. 13 and FIG. 14. FIG. 22 depicts a stage subsequent to that depicted in FIG. 13 and FIG. 14.

Referring to FIG. 22, the substrate 3' may be singulated along the singulation lines 39 (FIG. 13 and FIG. 14) from the second surface 32 to form a plurality of electrical components 3b of FIG. 12. Since the tip of the cutting tool 70 may have a wedge shape, the lateral surfaces 33 of the singulated electrical components 3b may be not parallel with each other. Thus, the singulated electrical component 3b may be a taper structure. The lateral surfaces 33 may be not perpendicular to the first surface 31 and the second surface 32. In some embodiments, the substrate 3' may be singulated along the singulation lines from the first surface 31 to form a plurality of electrical components 3a of FIG. 11.

Referring to FIG. 23, the electrical components 3b of FIG. 22 may be disposed on the backside surface 22 (e.g., a second surface) of the optical structure 2'. Then, the optical structure 2' may be singulated to form a plurality of optical devices 1b. Since the tip of the cutting tool 72 may have a wedge shape, the lateral surfaces 23 of the singulated optical components 2a may be not parallel with each other. Thus, the singulated optical component 2a may be a taper structure. The lateral surfaces 23 may be not perpendicular to the sensing surface 21 and the backside surface 22. A size of the backside surface 22 may be less than a size of the sensing surface 21.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing an optical device, comprising:
   providing a substrate;
   singulating the substrate to form a plurality of electrical components;
   providing an optical structure including a plurality of units, wherein each of the plurality of units has a sensing surface and a backside surface opposite to the sensing surface;

disposing the plurality of electrical components on the backside surfaces of the plurality of units of the optical structure; and singulating the optical structure later than singulating the substrate to form a plurality of optical devices.

2. The method of claim 1, wherein a normal line of a lateral surface of the optical component intersects with a normal line of a lateral surface of the electrical component at a point in a cross-sectional view, and a vertical projection of the point is outside a vertical projection of the one of the plurality of optical devices.

3. The method of claim 1, wherein one of the plurality of optical devices includes an electrical component and an optical component disposed on the electrical component, wherein an extension of a lateral surface of the electrical component extends through a lateral surface of the optical component.

4. The method of claim 1, wherein one of the plurality of optical devices includes an electrical component and an optical component disposed on the electrical component, wherein an angle between two lateral surfaces of two adjacent electrical components of the plurality of optical devices is greater than an angle between two lateral surfaces of two adjacent optical component of the plurality of optical devices.

* * * * *